(12) United States Patent
Chae et al.

(10) Patent No.: US 11,672,153 B2
(45) Date of Patent: Jun. 6, 2023

(54) DISPLAY DEVICE INCLUDING A CONNECTED AND/OR SHARED INTERMEDIATE LAYER

(71) Applicant: Samsung Display Co., Ltd., Yongin-si (KR)

(72) Inventors: Jongwon Chae, Yongin-si (KR); Moosoon Ko, Yongin-si (KR); Jinseock Ma, Yongin-si (KR); Sunghoon Moon, Yongin-si (KR); Sewan Son, Yongin-si (KR); Sangshin Lee, Yongin-si (KR); Yongje Jeon, Yongin-si (KR); Jingoo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 129 days.

(21) Appl. No.: 17/075,630

(22) Filed: Oct. 20, 2020

(65) Prior Publication Data
US 2021/0210564 A1    Jul. 8, 2021

(30) Foreign Application Priority Data
Jan. 2, 2020    (KR) ......................... 10-2020-0000493

(51) Int. Cl.
*H01L 27/32*    (2006.01)
*H01L 51/52*    (2006.01)

(52) U.S. Cl.
CPC ...... *H01L 27/3218* (2013.01); *H01L 27/3213* (2013.01); *H01L 27/3216* (2013.01);
(Continued)

(58) Field of Classification Search
CPC ............. H01L 27/3218; H01L 27/3213; H01L 27/3216; H01L 27/3248; H01L 27/3258; H01L 51/524; H01L 51/5256
(Continued)

(56) References Cited

U.S. PATENT DOCUMENTS 10,381,414 B2    8/2019    Lee
10,552,696 B2    2/2020    Cho et al.
(Continued)

FOREIGN PATENT DOCUMENTS

CN    105552102 A    5/2016
EP    3 382 683 A1    10/2018
(Continued)

*Primary Examiner* — Xia L Cross
(74) *Attorney, Agent, or Firm* — Lewis Roca Rothgerber Christie LLP

(57) ABSTRACT

A display device is provided. The display device includes: a substrate, a first display area in which a plurality of main sub-pixels are arranged on the substrate, and a second display area in which a basic unit is arranged, the basic unit including an auxiliary light-emitting area, in which a plurality of auxiliary sub-pixels are arranged on the substrate, and a transmission portion, wherein each of the plurality of auxiliary sub-pixels includes a pixel electrode on the substrate, an intermediate layer on the pixel electrode, and an opposite electrode on the intermediate layer, wherein intermediate layers of auxiliary sub-pixels for emitting light of a same color from among the plurality of auxiliary sub-pixels are connected to each other.

20 Claims, 18 Drawing Sheets

(52) U.S. Cl.
CPC ...... *H01L 27/3248* (2013.01); *H01L 27/3258* (2013.01); *H01L 51/524* (2013.01); *H01L 51/5256* (2013.01)

(58) Field of Classification Search
USPC .......................................................... 257/40
See application file for complete search history.

(56) References Cited

U.S. PATENT DOCUMENTS

| | | |
|---|---|---|
| 2011/0148944 A1 | 6/2011 | Kobayashi |
| 2011/0220901 A1 | 9/2011 | Ha et al. |
| 2012/0049206 A1* | 3/2012 | Choi ..................... H01L 27/326 257/E33.062 |
| 2012/0267611 A1* | 10/2012 | Chung ................ H01L 27/3272 257/E27.118 |
| 2015/0162391 A1 | 6/2015 | Kim |
| 2015/0228700 A1* | 8/2015 | Cho .................... H01L 27/3248 257/40 |
| 2018/0108685 A1* | 4/2018 | Kim ................... H01L 27/1262 |
| 2018/0350282 A1* | 12/2018 | Jin .......................... G02F 1/133 |

FOREIGN PATENT DOCUMENTS

| | | |
|---|---|---|
| KR | 10-2011-0108049 A | 10/2011 |
| KR | 10-2018-0067196 A | 6/2018 |
| KR | 10-2018-0068560 A | 6/2018 |

\* cited by examiner

DISPLAY DEVICE INCLUDING A CONNECTED AND/OR SHARED INTERMEDIATE LAYER

CROSS-REFERENCE TO RELATED APPLICATION

This application claims priority to and the benefit of Korean Patent Application No. 10-2020-0000493, filed on Jan. 2, 2020, in the Korean Intellectual Property Office (KIPO), the entire disclosure of which is incorporated herein by reference.

BACKGROUND

1. Field

One or more embodiments relate to a device, and more particularly, to a display device.

2. Description of Related Art

Applications of display devices have recently diversified. Moreover, because display devices have become thinner and lighter, their range of use has increased.

Given that display devices are utilized in various ways, various methods may be used to design the shapes of display devices, and functions that may be connected or linked to display devices may increase.

SUMMARY

One or more aspects of embodiments of the present disclosure are directed toward a display device including a first display area, which is a main display area, and a second display area, in which an optical element or the like may be arranged below the first display area. However, the one or more aspects of embodiments are only examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display device includes: a substrate, a first display area in which a plurality of main sub-pixels are on the substrate, and a second display area in which a basic unit is arranged, the basic unit including an auxiliary light-emitting area, in which a plurality of auxiliary sub-pixels are on the substrate, and a transmission portion, wherein each of the plurality of auxiliary sub-pixels includes a pixel electrode on the substrate, an intermediate layer on the pixel electrode, and an opposite electrode on the intermediate layer, and wherein intermediate layers of auxiliary sub-pixels for emitting light of a same color from among the plurality of auxiliary sub-pixels are connected to each other.

The plurality of auxiliary sub-pixels may be arranged in a stripe structure.

The plurality of auxiliary sub-pixels may be arranged in an RGBG Pentile matrix structure.

The display device may further include an inorganic insulating layer on the substrate, wherein the inorganic insulating layer may include an opening corresponding to the transmission portion.

The opposite electrode may be integrally provided in the plurality of main sub-pixels in the first display area and the plurality of auxiliary sub-pixels in the second display area, and may include an opening corresponding to the transmission portion.

The plurality of auxiliary sub-pixels may include a first auxiliary sub-pixel to emit light of a first color, and a plurality of second auxiliary sub-pixels to emit light of a second color, wherein a distance between the first auxiliary sub-pixel and each of the second auxiliary sub-pixels may be different from a distance between second auxiliary sub-pixels adjacent to each other from among the plurality of second auxiliary sub-pixels.

The intermediate layer may include at least one of an organic functional layer or an emission layer.

Emission layers of the intermediate layers of the auxiliary sub-pixels to emit light of the same color from among the plurality of auxiliary sub-pixels may be connected to each other.

The plurality of auxiliary sub-pixels may include: a plurality of first auxiliary sub-pixels to emit a first color, and a plurality of second auxiliary sub-pixels to emit a second color, wherein at least two of the plurality of second auxiliary sub-pixels may be between first auxiliary sub-pixels adjacent to each other from among the plurality of first auxiliary sub-pixels.

According to one or more embodiments, a display device includes: a substrate on which a first display area, in which main sub-pixels are arranged, and a second display area, which includes an auxiliary light-emitting area and a transmission portion, are arranged, a first auxiliary sub-pixel arranged in the auxiliary light-emitting area, the first auxiliary sub-pixel to emit light of a first color and including a first auxiliary pixel electrode and a first auxiliary intermediate layer, a plurality of second auxiliary sub-pixels spaced apart from each other in the auxiliary light-emitting area and to emit light of a second color, each of the second auxiliary sub-pixels including a second pixel electrode and a second auxiliary intermediate layer, and an opposite electrode integrally arranged in the auxiliary light-emitting area, wherein at least two of the plurality of second auxiliary sub-pixels share the second auxiliary intermediate layer.

The display device may further include a functional layer between the second auxiliary pixel electrode and the opposite electrode, wherein the functional layer may correspond to the transmission portion.

The display device may further include an inorganic insulating layer on the substrate, wherein the inorganic insulating layer may include an opening corresponding to the transmission portion.

The first display area and the second display area may be sealed by an encapsulation substrate facing the substrate.

The display device may further include a thin-film encapsulation layer including a first inorganic encapsulation layer, an organic encapsulation layer, and a second inorganic encapsulation layer sequentially arranged on the opposite electrode.

A length direction of the first auxiliary sub-pixel may be different from a length direction of a second auxiliary sub-pixel of the plurality of second auxiliary sub-pixels.

A length direction of the first auxiliary sub-pixel is parallel to a length direction of a second auxiliary sub-pixel of the plurality of second auxiliary sub-pixels.

At least one of the first or second auxiliary sub-pixels may be arranged in an RGBG Pentile matrix structure.

The display device may further include a plurality of first auxiliary sub-pixels including the first auxiliary sub-pixel, wherein at least two of the plurality of second auxiliary sub-pixels may be between first auxiliary sub-pixels adjacent to each other from among the plurality of first auxiliary sub-pixels.

The display device may further include a plurality of first auxiliary sub-pixels including the first auxiliary sub-pixel, wherein at least two of the plurality of first auxiliary sub-pixels may share the first auxiliary intermediate layer.

According to one or more embodiments, a display device includes: a substrate on which a first display area, in which main sub-pixels are arranged, and a second display area, which includes an auxiliary light-emitting area and a transmission portion, are arranged; and a plurality of auxiliary sub-pixels arranged in the auxiliary light-emitting area, each of the auxiliary sub-pixels including a pixel electrode and an intermediate layer, wherein the plurality of auxiliary sub-pixels include at least two auxiliary pixels to emit light of a same color, wherein the intermediate layers of the least two auxiliary sub-pixels for emitting light of the same color from among the plurality of auxiliary sub-pixels are connected to each other, and wherein the auxiliary sub-pixels including the intermediate layers connected to each other emit at least one of blue light, green light, or red light.

Other aspects, features, and advantages than the above-described aspects, features, and advantages will be apparent from a detailed description, the claims, and the drawings.

BRIEF DESCRIPTION OF THE DRAWINGS

The above and other aspects, features, and advantages of one or more example embodiments of the disclosure will be more apparent from the following description taken in conjunction with the accompanying drawings, in which.

DETAILED DESCRIPTION

Figure 1:
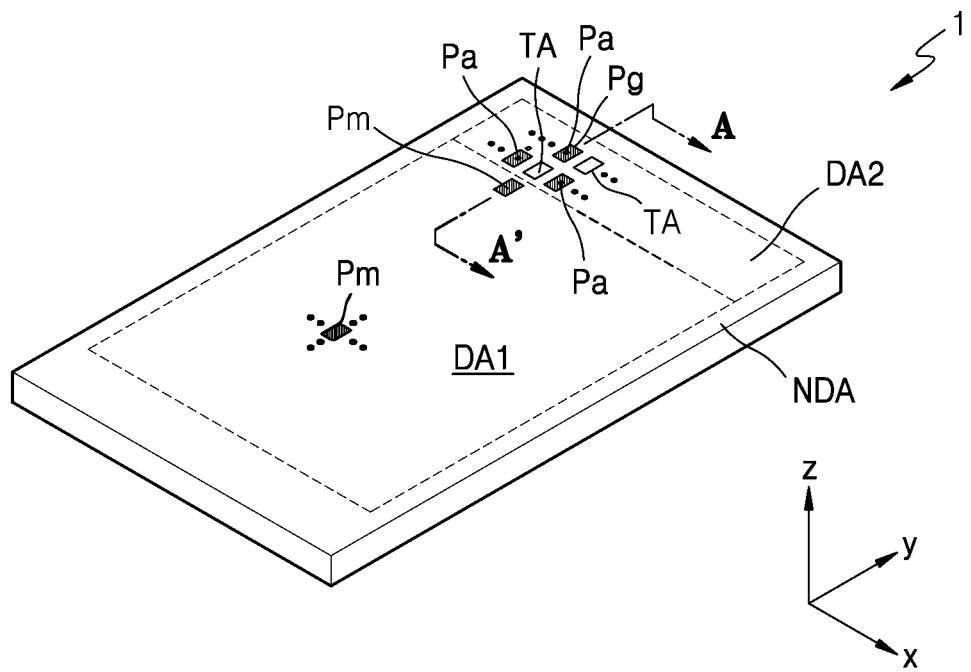
FIG. 1 is a schematic perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

One or more embodiments of the disclosure will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Further, the use of "may" when describing embodiments of the present disclosure refers to "one or more embodiments of the present disclosure".

As used herein, the phrase "a plan view" may refer to a view from top or from a direction normal to the display area of the display device.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Sizes of elements in the drawings may be exaggerated for convenience of explanation. In other words, since sizes and thicknesses of components in the drawings are arbitrarily illustrated for convenience of explanation, the following embodiments are not limited thereto.

When an example embodiment may be implemented differently, a specific process order may be performed differently from the described order. For example, two consecutively described processes may be performed substantially at the same time or performed in an order opposite to the described order.

In the following embodiments, when layers, regions, or components are connected to each other, the layers, the regions, or the components may be directly connected to each other, or another layer, another region, or another component may be interposed between the layers, the regions, or the components and thus the layers, the regions, or the components may be indirectly connected to each other. For example, in the following embodiments, when layers, regions, or components are electrically connected to each other, the layers, the regions, or the components may be directly electrically connected to each other, or another layer, another region, or another component may be interposed between the layers, the regions, or the components and thus the layers, the regions, or the components may be indirectly electrically connected to each other.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display device 1 according to an embodiment.

Referring to FIG. 1, the display device 1 includes a first display area DA1, in which an image is realized, and a non-display area NDA, in which no images are realized. The display device 1 may provide a main image by using light emitted from a plurality of main sub-pixels Pm arranged in the first display area DA1.

The display device 1 includes a second display area DA2. A component such as a sensor using infrared light, visible light, or sound may be arranged in or underneath the second display area DA2, as will be described below with reference to FIG. 2. The second display area DA2 may include a transmission portion TA capable of transmitting light and/or sound that is output from a component to the outside or travels from the outside toward the component. In one or more embodiments, when light is transmitted through the second display area DA2, a light transmittance in the second display area DA2 may be about 30% or greater, for example, 50% or greater, 75% or greater, 80% or greater, 85% or greater, or 90% or greater.

According to the present embodiment, the second display area DA2 may include an auxiliary light-emitting area Pg in which a plurality of auxiliary sub-pixels Pa are arranged, and a set or certain image may be provided using light emitted from the plurality of auxiliary sub-pixels Pa. An image provided by the second display area DA2 is an auxiliary image and thus may have lower resolution than an image provided by the first display area DA1. In other words, because the second display area DA2 includes the transmission portion TA capable of transmitting light and/or sound, the number of auxiliary sub-pixels Pa arranged on a unit area may be less than the number of main sub-pixels Pm arranged on a unit area in the first display area DA1.

The second display area DA2 may be arranged on or adjacent to one side of the first display area DA1. In an embodiment, FIG. 1 illustrates that the second display area DA2 is arranged at an upper side of the first display area DA1 and thus the second display area DA2 is arranged between the non-display area NDA and the first display area DA1. However, the disclosure is not limited thereto. The second display area DA2 may be arranged to be surrounded by the first display area DA1 (e.g., as shown in the embodiment of FIG. 3B) and may be variously modified in a suitable manner.

For example, although FIG. 1 illustrates that the second display area DA2 is arranged at the upper side of the first display area DA1 having a rectangular shape, the disclosure is not limited thereto. The shape of the first display area DA1 may be a circle, an ellipse, or a polygon such as a triangle or a pentagon, and the second display area DA2 may be arranged in the first display area DA1 (i.e., the second display area DA2 may be surrounded by the first display area DA1) and may have various suitable shapes.

Although an organic light-emitting display device will now be illustrated and described as the display device 1, the display device 1 is not limited thereto. According to another embodiment, various suitable types of display devices, such as an inorganic light-emitting display device and a quantum dot light-emitting display device may be used.

Figure 2:
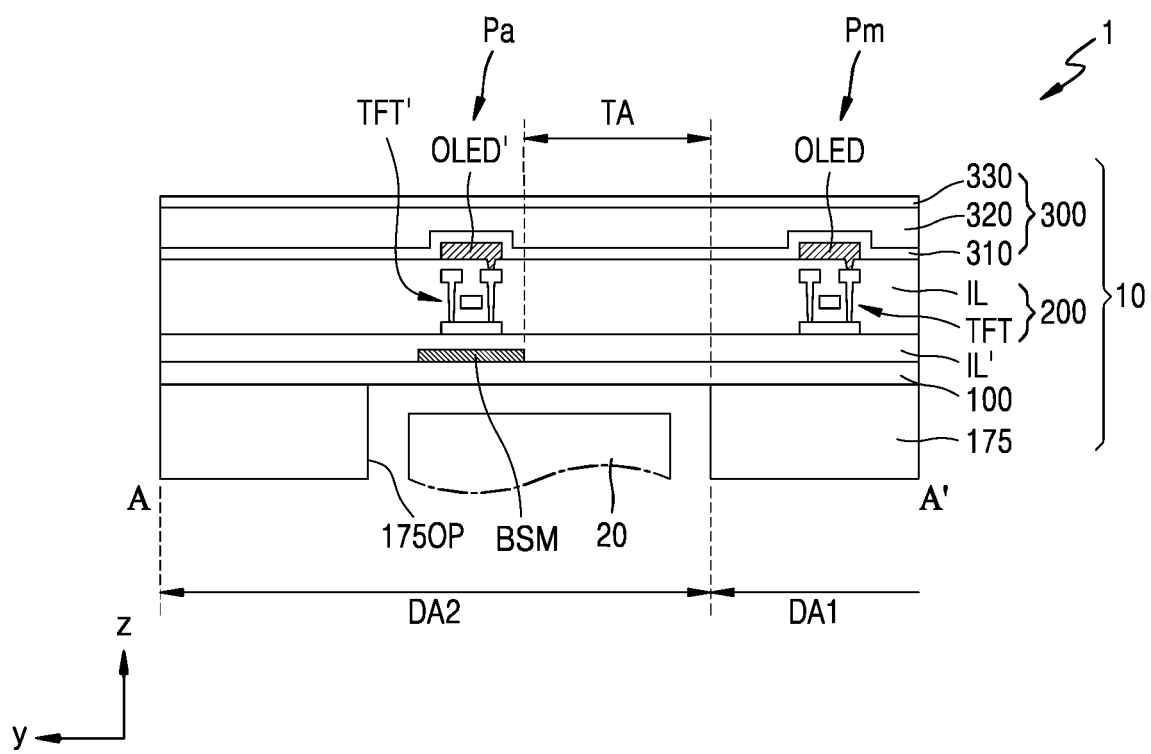
FIG. 2 is a schematic cross-sectional view of the display device taken along the line A-A' of FIG. 1 according to an embodiment.

FIG. 2 is a schematic cross-sectional view of the display device 1 according to an embodiment, taken along the line A-A' of FIG. 1.

Referring to FIG. 2, the display device 1 may include a display panel 10 including a display element, and a component 20 corresponding to the second display area DA2. In one or more embodiments, component 20 may be in or underneath the second display area DA2.

The display panel 10 may include a substrate 100, a display element layer 200 arranged on the substrate 100 (e.g., the display element layer 200 may be on the substrate 100 with an insulating layer IL' therebetween), and a thin-film encapsulation layer 300 being an encapsulation member that seals the display element layer 200. The display panel 10 may further include a lower protection film 175 arranged below the substrate 100.

The substrate 100 may include glass or polymer resin. The polymer resin may include polyethersulphone, polyacrylate, polyetherimide, polyethylene naphthalate, polyethylene terephthalate, polyphenylene sulfide, polyarylate, polyimide, polycarbonate, cellulose acetate propionate, and/or the like. The substrate 100 including polymer resin may be flexible, rollable, and/or bendable. The substrate 100 may have a multi-layered structure including a layer including the aforementioned polymer resin and an inorganic layer.

The display element layer 200 may include a circuit layer including thin-film transistors (e.g., first and second thin-film transistors TFT and TFT'), display elements (e.g., organic light-emitting diodes OLED and OLED'), and insulating layers IL therebetween (e.g., as shown in the embodiment of FIG. 2).

In the first display area DA1, a main sub-pixel Pm including a first thin-film transistor TFT and an organic light-emitting diode OLED connected to the first thin-film transistor TFT may be arranged. In the second display area DA2, an auxiliary sub-pixel Pa including a second thin-film transistor TFT' and an organic light-emitting diode OLED' connected to the second thin-film transistor TFT' may be arranged.

In the second display area DA2, the transmission portion TA having no pixel arranged therein may be arranged. The transmission portion TA may be understood as a transmission area that transmits light/signals emitted by the component 20 or light/signals incident upon the component 20. In one or more embodiments, the transmission portion TA overlaps the components 20 and does not include a pixel. In one or more embodiments, the transmission portion TA may be arranged to alternate with the auxiliary light-emitting area Pg. In other words, a transmission portion TA may be arranged between auxiliary light-emitting areas Pg adjacent to each other, and an auxiliary light-emitting area Pg may be arranged between transmission portions TA adjacent to each other (e.g., as shown in the embodiment of FIG. 1).

The component 20 may be located in or underneath the second display area DA2. The component 20 may be an electronic element that uses light and/or sound. For example, the component 20 may be a sensor that receives and uses light, like an infrared sensor, a sensor that outputs and senses light and/or sound to measure a distance or recognize a fingerprint or the like, a small lamp that outputs light, a speaker that outputs sound, and/or a camera. An electronic element using light may use light in various suitable wavelength bands, such as visible light, infrared light, and/or ultraviolet light. In one or more embodiments, a plurality of components 20 may be arranged in the second display area DA2. For example, a light-emitting device and a light-receiving device as the component 20 may be both included in or underneath a single second display area DA2. Alternatively, both a light-emitting portion and a light-receiving portion may be included in a single component (e.g., component 20).

A lower electrode layer BSM may be arranged in the second display area DA2. The lower electrode layer BSM may be arranged to correspond to a lower portion of the second thin-film transistor TFT'. In one or more embodiments, the second thin-film transistor TFT' may overlap the lower electrode layer BSM. The lower electrode layer BSM may block external light from reaching the auxiliary sub-pixel Pa including the second thin-film transistor TFT' and the like. For example, the lower electrode layer BSM may block light emitted from the component 20 from reaching the auxiliary sub-pixel Pa.

In one or more embodiments, a constant voltage or a signal may be applied to the lower electrode layer BSM to prevent or reduce damage to a pixel circuit due to electrostatic discharge.

The thin-film encapsulation layer 300 may include at least one inorganic encapsulation layer and at least one organic encapsulation layer. With regard to this, FIG. 2 illustrates first and second inorganic encapsulation layers 310 and 330 and an organic encapsulation layer 320 therebetween.

Each of the first inorganic encapsulation layer 310 and the second inorganic encapsulation layer 330 may include one or more inorganic insulating materials, such as aluminum oxide, titanium oxide, tantalum oxide, hafnium oxide, zinc oxide, silicon oxide, silicon nitride, and/or silicon oxynitride. The organic encapsulation layer 320 may include a polymer-based material. Examples of the polymer-based material may include acryl-based resin, epoxy-based resin, polyimide, and polyethylene.

The lower protection film 175 may be attached to a lower surface of the substrate 100 and may support and protect the substrate 100. The lower protection film 175 may include an opening 175OP corresponding to the second display area DA2. The lower protection film 175 may improve the light transmittance of the second display area DA2 by including the opening 175OP. The lower protection film 175 may include polyethylene terephthalate (PET) and/or polyimide (PI).

The second display area DA2 may have a larger area (e.g., a larger planar area in the x-y plane) than an area where the component 20 is arranged. In one or more embodiments, the second display area DA2 may extend farther in the x direction and/or y direction than the component 20. Accordingly, the area of the opening 175OP in the lower protection film 175 may not be identical to the area of the second display area DA2. For example, the area of the opening 175OP may be less than the area of the second display area DA2.

In one or more embodiments, a plurality of components 20 may be arranged in the second display area DA2. The plurality of components 20 may have different suitable functions. For example, one of the plurality of components 20 may be a camera and another one may be an infrared sensor.

In one or more embodiments, one or more component(s), such as an input sensing member for sensing a touch input, an anti-reflection member including a polarizer and a retarder, or a color filter and a black matrix, and a transparent window, may be arranged on the display panel 10.

According to the present embodiment, the thin-film encapsulation layer 300 is used as an encapsulation member that seals the display element layer 200, but the disclosure is not limited thereto. For example, an encapsulation substrate coupled with the substrate 100 by a sealant or frit may be used as a member that seals the display element layer 200.

Figure 3A:
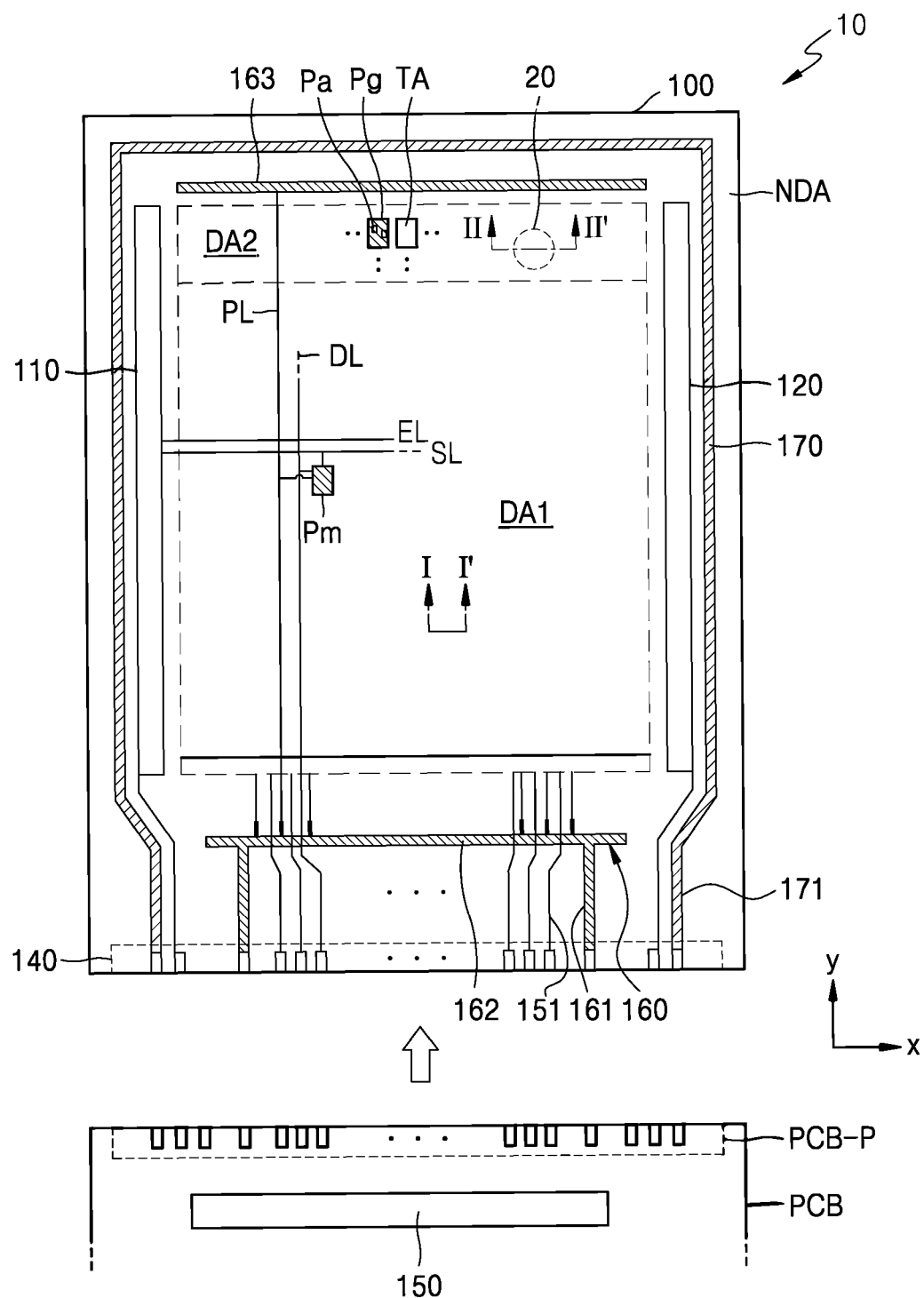
FIGS. 3A and 3B are schematic plan views of a display panel according to an embodiment.
Figure 3B:
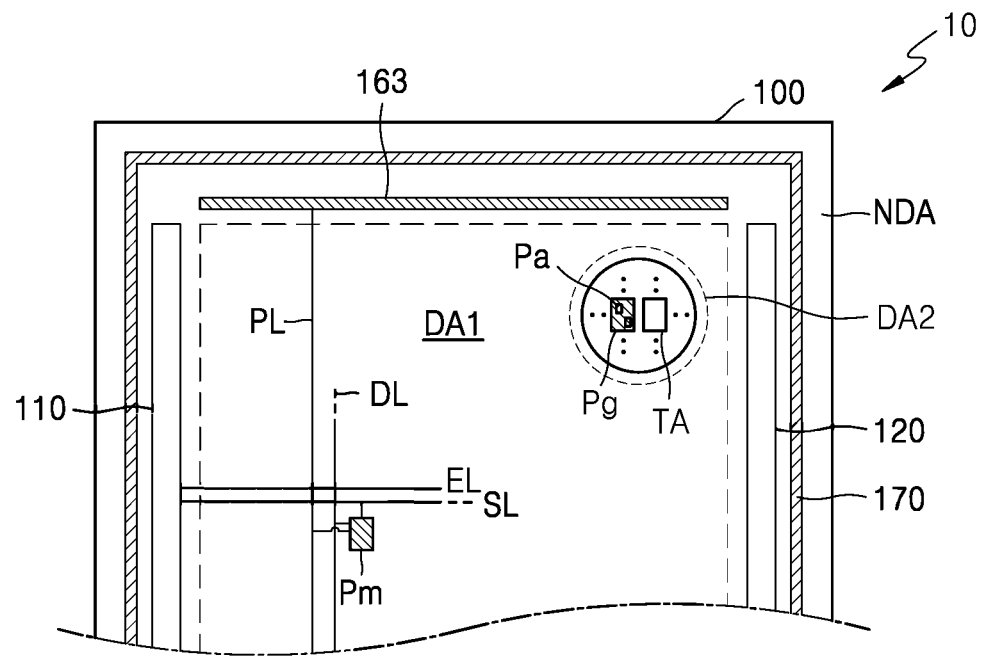

FIGS. 3A and 3B are schematic plan views of the display panel 10 according to an embodiment.

Referring to FIGS. 3A and 3B, the display panel 10 is arranged in the first display area DA1 and includes a plurality of main sub-pixels Pm. The main sub-pixels Pm may each include a display element such as an organic light-emitting diode. Each of the main sub-pixels Pm may emit any one of red light, green light, blue light, or white light from the organic light-emitting diode. The first display area DA1 may be covered with the encapsulation member described above with reference to FIG. 2 to be protected from external air or moisture.

The second display area DA2 may be arranged on or adjacent to one side of the first display area DA1, and the auxiliary light-emitting area Pg in which the plurality of auxiliary sub-pixels Pa are arranged is arranged in the second display area DA2. Each of the auxiliary sub-pixels Pa may include a display element such as an organic light-emitting diode. Each of the auxiliary sub-pixels Pa may emit of any one of, for example, red light, green light, blue light, or white light from the organic light-emitting diode. In this case, at least two auxiliary sub-pixels (e.g., two auxiliary sub-pixels from among Pa1, Pa2, and Pa3 (see FIG. 5)) emitting light of the same color may be arranged in the auxiliary light-emitting area Pg. A transmission portion TA arranged between auxiliary light-emitting areas Pg may be arranged in the second display area DA2. At least one component 20 may be arranged to correspond to a lower portion (e.g., a lower portion in a thickness direction or z direction) of the second display area DA2 of the display panel 10.

In one or more embodiments, one main sub-pixel Pm and one auxiliary sub-pixel Pa may include the same pixel circuit. However, the disclosure is not limited thereto. A pixel circuit in the main sub-pixel Pm and a pixel circuit in the auxiliary sub-pixel Pa may be different from each other. Because the second display area DA2 includes the transmission portion TA, the resolution of the second display area DA2 may be less than that of the first display area DA1.

Each of the main sub-pixel Pm and the auxiliary sub-pixel Pa may be connected (e.g., electrically connected) to outer circuits arranged in the non-display area NDA. In the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide a scan signal to each of the main sub-pixel Pm and the auxiliary sub-pixel Pa through a scan line SL. The first scan driving circuit 110 may provide a light-emission control signal to each sub-pixel through a light-emission control line EL. The second scan driving circuit 120 may be arranged in parallel with the first scan driving circuit 110 with the first display area DA1 and the second display area DA2 therebetween. Some of the main and auxiliary sub-pixels Pm and Pa arranged in the first display area DA1 and the second display area DA2 may be connected (e.g., electrically connected) to the first scan driving circuit 110, and the others may be connected to the second scan driving circuit 120. In another embodiment, the second scan driving circuit 120 may be omitted.

The terminal 140 may be arranged on or adjacent to one side of a substrate 100. The terminal 140 may be exposed (i.e., the terminal may not be covered by an insulating layer) and connected (e.g., electrically connected) to a printed circuit board PCB. A terminal PCB-P of the printed circuit board PCB may be connected (e.g., electrically connected) to the terminal 140 of the display panel 10. The printed circuit board PCB transmits a signal or power of a controller to the display panel 10. A control signal generated by the controller may be transmitted to the first and second scan driving circuits 110 and 120 through the printed circuit board PCB. The controller may provide first and second power supply voltages ELVDD and ELVSS (see FIG. 4A, the second power supply voltage also be referred to as a common voltage) to first and second power supply lines 160 and 170 through first and second connection lines 161 and 171, respectively. The first power supply voltage ELVDD may be provided to each of the main and auxiliary sub-pixels Pm and Pa through a driving voltage line PL connected to the first power supply line 160, and the second power supply voltage ELVSS may be provided to an opposite electrode of each of the main and auxiliary sub-pixels Pm and Pa connected to the second power supply line 170.

The data driving circuit 150 is connected (e.g., electrically connected) to a data line DL. A data signal of the data driving circuit 150 may be provided to each of the main and auxiliary sub-pixels Pm and Pa through a connection line 151 connected to the terminal 140 and the data line DL connected to the connection line 151. FIG. 3A illustrates that the data driving circuit 150 is arranged on the printed circuit board PCB. However, in another embodiment, the data driving circuit 150 may be arranged on the substrate 100. For example, the data driving circuit 150 may be arranged on the substrate 100 and between the terminal 140 and the first power supply line 160.

The first power supply line 160 may include a first sub line 162 and a second sub line 163 extending in parallel (e.g., parallel to each other) in the x direction with the first display area DA1 therebetween. The second power supply line 170 may partially surround the first display area DA1 in a loop shape with one open side (e.g., the side adjacent to the terminal 140).

In FIG. 3A, the second display area DA2 is illustrated as being arranged on or adjacent to one side of the first display area DA1. However, the disclosure is not limited thereto. For example, as illustrated in FIG. 3B, the second display area DA2 may be provided as an area corresponding to a sensor arranged underneath the second display area DA2. In this case, the second display area DA2 may be arranged in the first display area DA1 (i.e., the second display area DA2 may be surrounded by the first display area DA1).

Figure 4A:
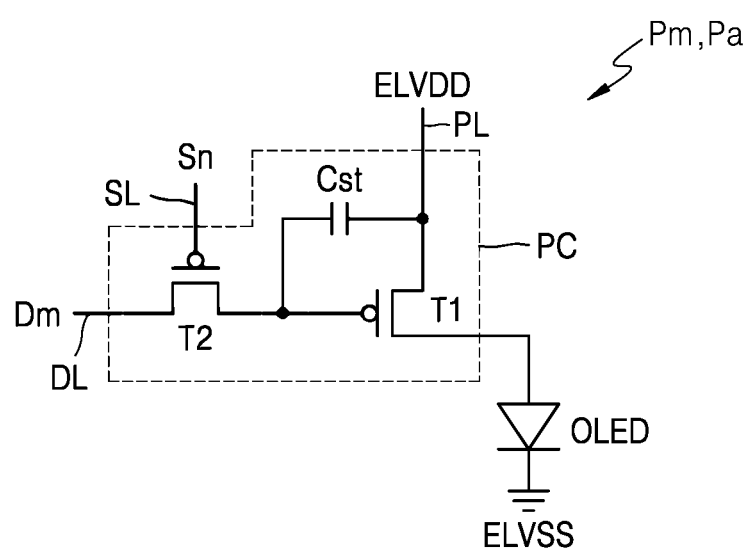
FIG. 4A is an equivalent circuit diagram of a sub-pixel of a display panel according to an embodiment.
Figure 4B:
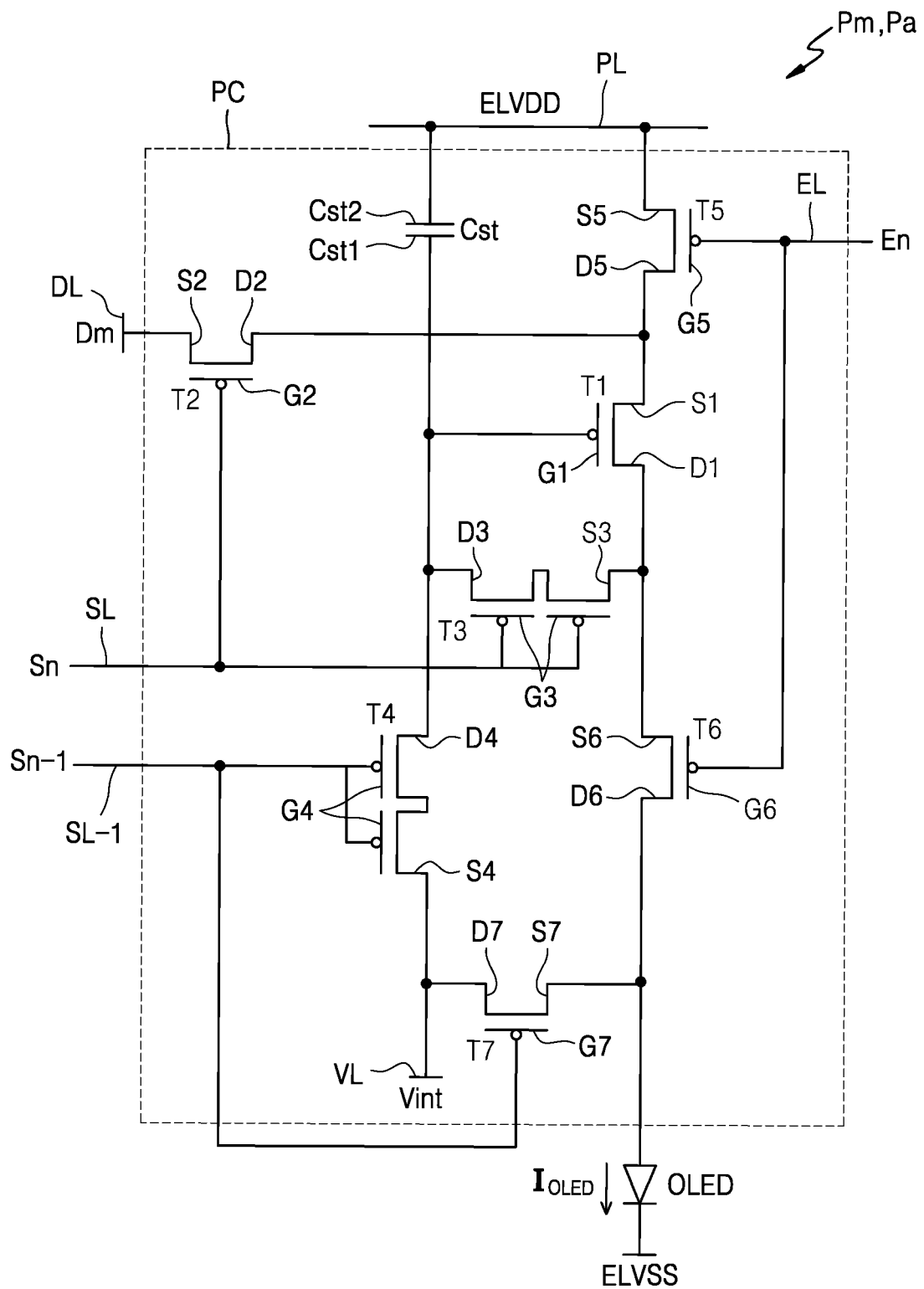
FIG. 4B is an equivalent circuit diagram of a pixel of a display panel according to an embodiment.

FIGS. 4A and 4B are equivalent circuit diagrams of a sub-pixels Pm and Pa of a display panel according to an embodiment.

Referring to FIG. 4A, each of the main sub-pixel Pm and the auxiliary sub-pixel Pa includes a pixel circuit PC connected to a scan line SL and a data line DL, and an organic light-emitting diode OLED connected to the pixel circuit PC.

The pixel circuit PC includes a driving thin-film transistor T1, a switching thin-film transistor T2, and a storage capacitor Cst (hereinafter, which is divided into a main storage capacitor Cst and an auxiliary storage capacitor Cst' (see FIG. 6) according to the area where it is located). The switching thin-film transistor T2 is connected to the scan line SL (e.g., the gate electrode of the switching thin-film transistor T2 is connected to the scan line SL) and the data line DL, and is configured to transmit, to the driving thin-film transistor T1, a data signal Dm received via the data line DL according to or based on a scan signal Sn received via the scan line SL.

The storage capacitor Cst is connected to the switching thin-film transistor T2 and a driving voltage line PL, and stores a voltage corresponding to a difference between a voltage received from the switching thin-film transistor T2 and the first power supply voltage ELVDD (or referred to as a driving voltage) supplied to the driving voltage line PL.

The driving thin-film transistor T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a set or certain brightness according to or based on the driving current.

Although a case where the pixel circuit PC includes two thin-film transistors and one storage capacitor is illustrated in FIG. 4A, the disclosure is not limited thereto. As shown in FIG. 4B, the pixel circuit PC may include seven thin-film transistors and one storage capacitor.

Referring to FIG. 4B, each of the main sub-pixel Pm and the auxiliary sub-pixel Pa includes a pixel circuit PC and an organic light-emitting diode OLED connected to the pixel circuit PC. The pixel circuit PC may include a plurality of thin-film transistors and a storage capacitor. The thin-film transistors and the storage capacitor may be connected to signal lines SL, SL−1, EL, and DL, an initializing voltage line VL, and a driving voltage line PL.

Figure 5:
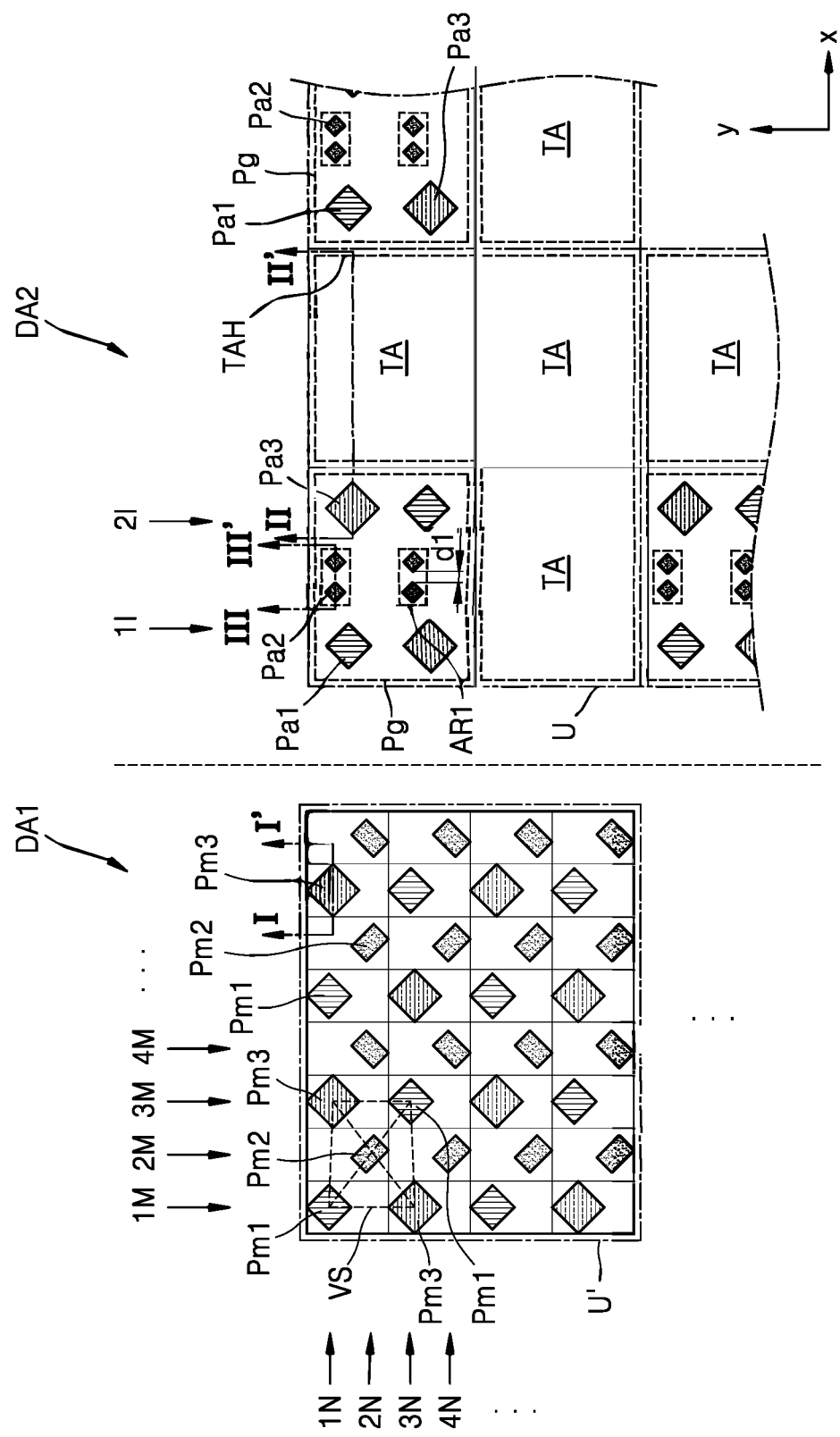
FIG. 5 is a schematic plan view of an arrangement of sub-pixels and a transmission portion arranged in a first display area and a second display area.

Although each of the main sub-pixel Pm and the auxiliary sub-pixel Pa is connected to the signal lines SL, SL−1, EL, and DL, the initializing voltage line VL, and the driving voltage line PL in FIG. 5, the disclosure is not limited thereto. According to another embodiment, the initializing voltage line VL, the driving voltage line PL, and at least one of the signal lines SL, SL−1, EL, or DL may be shared by neighboring pixels.

The plurality of thin-film transistors may include a driving thin-film transistor T1, a switching thin-film transistor T2, a compensating thin-film transistor T3, a first initializing thin-film transistor T4, an operation control thin-film transistor T5, a light-emission control thin-film transistor T6, and a second initializing thin-film transistor T7.

The signal lines SL, SL−1, EL, and DL include a scan line SL that transmits a scan signal Sn, a previous scan line SL−1 that transmits a previous scan signal Sn−1 to the first initializing thin-film transistor T4 and the second initializing thin-film transistor T7, a light-emission control line EL that transmits a light-emission control signal En to the operation control thin-film transistor T5 and the light-emission control thin-film transistor T6, and a data line DL that intersects with the scan line SL and transmits a data signal Dm. The driving voltage line PL is configured to transmit a driving voltage ELVDD to the driving thin-film transistor T1, and the initializing voltage line VL transmits an initializing voltage Vint that initiates the driving thin-film transistor T1 and a pixel electrode of the organic light-emitting diode OLED.

The driving thin-film transistor T1 includes a driving gate electrode G1 connected to a first electrode Cst1 of the storage capacitor Cst, a driving source electrode S1 connected to the driving voltage line PL via the operation control thin-film transistor T5, and a driving drain electrode D1 connected (e.g., electrically connected) to the pixel electrode of the organic light-emitting diode OLED via the light-emission control thin-film transistor T6. The driving thin-film transistor T1 receives the data signal Dm according to or based on a switching operation of the switching thin-film transistor T2 and supplies a driving current $I_{OLED}$ to the organic light-emitting diode OLED.

The switching thin-film transistor T2 includes a switching gate electrode G2 connected to the scan line SL, a switching source electrode S2 connected to the data line DL, and a switching drain electrode D2 connected to the driving source electrode S1 of the driving thin-film transistor T1 and also connected to the driving voltage line PL via the operation control thin-film transistor T5. The switching thin-film transistor T2 is turned on according to or based on the scan signal Sn received via the scan line SL and performs a switching operation of transmitting the data signal Dm received from the data line DL to the driving source electrode S1 of the driving thin-film transistor T1.

The compensating thin-film transistor T3 includes a compensating gate electrode G3 connected to the scan line SL, a compensating source electrode S3 connected to the driving drain electrode D1 of the driving thin-film transistor T1 and also connected to the pixel electrode of the organic light-emitting diode OLED via the light-emission control thin-film transistor T6, and a compensating drain electrode D3 connected to the first electrode Cst1 of the storage capacitor Cst, a first initializing drain electrode D4 of the first initializing thin-film transistor T4, and the driving gate electrode G1 of the driving thin-film transistor T1. The compensating thin-film transistor T3 is turned on according to or based on the scan signal Sn received via the scan line SL and connects (e.g., electrically connects) the driving gate electrode G1 and the driving drain electrode D1 of the driving thin-film transistor T1 to each other, such that the driving thin-film transistor T1 is diode-connected.

The first initializing thin-film transistor T4 includes a first initializing gate electrode G4 connected to the previous scan line SL−1, a first initializing source electrode S4 connected to a second initializing drain electrode D7 of the second initializing thin-film transistor T7 and the initializing voltage line VL, and the first initializing drain electrode D4 connected to the first electrode Cst1 of the storage capacitor Cst, the compensating drain electrode D3 of the compensating thin-film transistor T3, and the driving gate electrode G1 of the driving thin-film transistor T1. The first initializing thin-film transistor T4 is turned on according to or based on the previous scan signal Sn−1 received via the previous scan line SL−1 and is configured to transmit the initializing voltage Vint to the driving gate electrode G1 of the driving thin-film transistor T1 to thereby initialize a voltage of the driving gate electrode G1 of the driving thin-film transistor T1.

The operation control thin-film transistor T5 includes an operation control gate electrode G5 connected to the light-emission control line EL, an operation control source electrode S5 connected to the driving voltage line PL, and an operation control drain electrode D5 connected to the driving source electrode S1 of the driving thin-film transistor T1 and the switching drain electrode D2 of the switching thin-film transistor T2.

The light-emission control thin-film transistor T6 includes a light-emission control gate electrode G6 connected to the light-emission control line EL, a light-emission control source electrode S6 connected to the driving drain electrode D1 of the driving thin-film transistor T1 and the compensating source electrode S3 of the compensating thin-film transistor T3, and a light-emission control drain electrode D6 connected (e.g., electrically connected) to a second initializing source electrode S7 of the second initializing thin-film transistor T7 and the pixel electrode of the organic light-emitting diode OLED.

The operation control thin-film transistor T5 and the light-emission control thin-film transistor T6 are concurrently (e.g., simultaneously) turned on according to or based on the light-emission control signal En received via the light-emission control line EL, and thus, the driving voltage ELVDD is transmitted to the organic light-emitting diode OLED such that the driving current $I_{OLED}$ may flow in the organic light-emitting diode OLED.

The second initializing thin-film transistor T7 includes a second initializing gate electrode G7 connected to the previous scan line SL−1, the second initializing source electrode S7 connected to the light-emission control drain electrode D6 of the light-emission control thin-film transistor T6 and the pixel electrode of the organic light-emitting diode OLED, and the second initializing drain electrode D7 connected to the first initializing source electrode S4 of the first initializing thin-film transistor T4 and the initializing voltage line VL. The second initializing thin-film transistor T7 is turned on according to or based on the previous scan signal Sn−1 received via the previous scan line SL−1 and initializes the pixel electrode of the organic light-emitting diode OLED.

Although the first initializing thin-film transistor T4 and the second initializing thin-film transistor T7 are connected to the previous scan line SL−1 in FIG. 4B, the disclosure is not limited thereto. According to another embodiment, the first initializing thin-film transistor T4 may be connected to the previous scan line SL−1 and operate according to or based on the previous scan signal Sn−1, and the second initializing thin-film transistor T7 may be connected to a separate signal line (e.g., a subsequent scan line) and operate according to or based on a signal transmitted to the separate signal line.

A second electrode Cst2 of the storage capacitor Cst is connected to the driving voltage line PL, and an opposite electrode of the organic light-emitting diode OLED is connected to the common voltage ELVSS. Accordingly, the organic light-emitting diode OLED may receive the driving current $I_{OLED}$ from the driving thin-film transistor T1 and emit light, thereby displaying an image.

Although each of the compensating thin-film transistor T3 and the first initializing thin-film transistor T4 has a dual gate electrode in FIG. 4B, each of the compensating thin-film transistor T3 and the first initializing thin-film transistor T4 may have a single gate electrode.

In the present embodiment, the main sub-pixel Pm and the auxiliary sub-pixel Pa may include the same pixel circuit PC (e.g., employ the same pixel circuit configuration). However, the disclosure is not limited thereto. The main sub-pixel Pm and the auxiliary sub-pixel Pa may include pixel circuits having different suitable structures. For example, the main sub-pixel Pm may employ the pixel circuit of FIG. 4B, and the auxiliary sub-pixel Pa may employ the pixel circuit of FIG. 4A. In one or more embodiments, the main sub-pixel Pm may employ the pixel circuit of FIG. 4A, and the auxiliary sub-pixel Pa may employ the pixel circuit of FIG. 4B.

Figure 6:
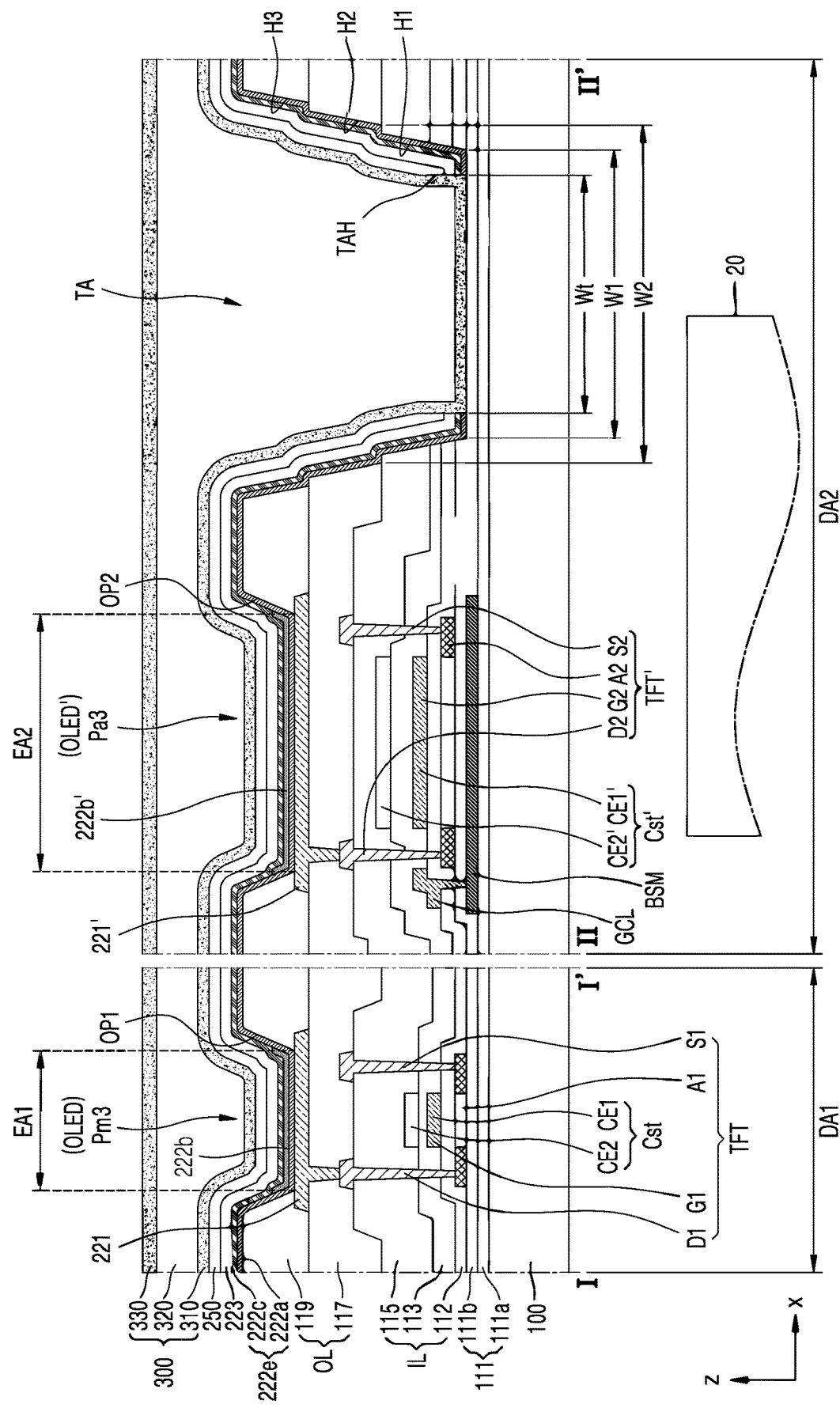
FIG. 6 is a schematic cross-sectional view of a display device taken along the line I-I' and line II-II' of FIG. 5.

FIG. 5 is a schematic plan view of an arrangement of a light-emitting area and a transmission area of sub-pixels arranged in a first display area and a second display area, and FIG. 6 is a schematic cross-sectional view of a display device taken along the line I-I' and the line II-II' of FIG. 5.

Referring to FIGS. 5 and 6, main sub-pixels Pm1, Pm2, and Pm3, are arranged in a first display area DA1 of a display device according to an embodiment, and an auxiliary light-emitting area Pg including auxiliary sub-pixels Pa1, Pa2, and Pa3 and a transmission portion TA are arranged in a second display area DA2 of the display device.

In the present embodiment, the main sub-pixels Pm1, Pm2, and Pm3 arranged in the first display area DA1 and the auxiliary sub-pixels Pa1, Pa2, and Pa3 arranged in the second display area DA2 may have different pixel array structures. In the present specification, the arrangement structure of pixels is described based on a light-emitting area of each sub-pixel. In this case, the light-emitting area of the sub-pixel may be defined by an opening of a pixel-defining layer, which will be described in more detail below.

As shown in FIG. 5, the main sub-pixels Pm1, Pm2, and Pm3 in the first display area DA1 may be arranged in a structure such as a Pentile structure (PENTILE® is a registered trademark of Samsung Display Co., Ltd., Republic of Korea). A first main sub-pixel Pm1, a second main sub-pixel Pm2, and a third main sub-pixel Pm3 may implement or provide different colors. For example, the first main sub-pixel Pm1, the second main sub-pixel Pm2, and the third main sub-pixel Pm3 may implement red, green, and blue, respectively. In other words, the first main sub-pixel Pm1, the second main sub-pixel Pm2, and the third main sub-pixel Pm3 may provide red light, green light, and blue light, respectively.

In one or more embodiments, a plurality of first main sub-pixels Pm1 and a plurality of third main sub-pixels Pm3 are alternately arranged in a first row 1N. A plurality of second main sub-pixels Pm2 may be arranged (e.g., repeatedly arranged) in an adjacent second row 2N (e.g., a second row 2N adjacent to the first row 1N) and may be spaced apart from each other by a set or certain interval. A plurality of third main sub-pixels Pm3 and a plurality of first main sub-pixels Pm1 may be alternately arranged in an adjacent third row 3N (e.g., the third row 3N adjacent to the second row 2N). A plurality of second main sub-pixels Pm2 may be arranged in an adjacent fourth row 4N (e.g., a fourth row 4N adjacent to the third row 3N) and may be spaced apart from each other by a set or certain interval. This arrangement of pixels may be repeated up to an Nth row. Here, N denotes a natural number greater than zero. In one or more embodiments, the area of each of the third main sub-pixel Pm3 and the first main sub-pixel Pm1 may be larger (e.g., larger in a plan view as shown in FIG. 5) than that of the second main sub-pixel Pm2.

The plurality of first and third main sub-pixels Pm1 and Pm3 arranged in the first row 1N and the plurality of second main sub-pixels Pm2 arranged in the second row 2N are staggered. In other words, the plurality of first and third main sub-pixels Pm1 and Pm3 arranged in the first row 1N may be offset in the x direction from (i.e., not share a column with) the plurality of second main sub-pixels Pm2 arranged in the second row 2N. Accordingly, the first main sub-pixel Pm1 and the third main sub-pixel Pm3 are alternately arranged in a first column 1M, the plurality of second main sub-pixels Pm2 are arranged in an adjacent second column 2M (e.g., a second column 2M adjacent to the first column 1M) and are spaced apart from each other by a set or certain interval, the third main sub-pixel Pm3 and the first main sub-pixel Pm1 are alternately arranged in an adjacent third column 3M (e.g., a third column 3M adjacent to the second column 2M), and the plurality of second main sub-pixels Pm2 are arranged in an adjacent fourth column 4M (e.g., a fourth column 4M adjacent to the third column 3M) and are spaced apart from each other by a set or certain interval. This arrangement of pixels may be repeated up to an Mth column. Here, M denotes a natural number greater than zero.

In one or more embodiments, the first main sub-pixel Pm1 is arranged at each of the first and third vertices facing each other from among the vertices of a virtual quadrangle VS having the center point of the second main sub-pixel Pm2 at the center point of the virtual quadrangle VS, and the third main sub-pixel Pm3 is arranged at each of the second and fourth vertices, which are the remaining vertices. The second main sub-pixel Pm2 may be at a center point between the first main sub-pixels Pm1 arranged at each of the first and the third vertices, and be at a center point between the third main sub-pixels Pm3 arranged at each of the second and fourth vertices. In one or more embodiments, the virtual quadrangle VS may be variously modified in a suitable manner. For example, the virtual quadrangle VS may be a rectangle, a rhombus, or a square.

Such a pixel arrangement structure may be a matrix structure (e.g., a Pentile® matrix structure), and in this case, a high resolution may be realized with a small number of pixels by using a rendering driving scheme that shares adjacent pixels to represent colors.

The auxiliary sub-pixels Pa1, Pa2, and Pa3 in the second display area DA2 may be arranged similarly to the main sub-pixels Pm1, Pm2, and Pm3. That is, the auxiliary sub-pixels Pa1, Pa2, and Pa3 may be arranged in an RGBG structure (e.g., an RGBG Pentile® structure). A first auxiliary sub-pixel Pa1, a second auxiliary sub-pixel Pa2, and a third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide red light, green light, and blue light, respectively. In one or more embodiments, in contrast to the main sub-pixels, two or more auxiliary sub-pixels emitting light of the same color may be arranged in the center of the auxiliary light-emitting area Pg.

The first auxiliary sub-pixel Pa1 and the third auxiliary sub-pixel Pa3 may be sequentially arranged in a first column 1I, and the third auxiliary sub-pixel Pa3 and the first auxiliary sub-pixel Pa1 may be sequentially arranged in an adjacent second column 2I. In this case, the first auxiliary sub-pixel Pa1 and the third auxiliary sub-pixel Pa3 may be arranged to face each other in the first column 1I and the second column 2I. In other words, the first auxiliary sub-pixel Pa1 in the first column 1I corresponds to the third auxiliary sub-pixel Pa3 in the second column 2I and the third auxiliary sub-pixel Pa3 in the first column 1I corresponds to the first auxiliary sub-pixel Pa1 in the second column 2I.

A plurality of second auxiliary sub-pixels Pa2 may be arranged between the first auxiliary sub-pixel Pa1 and the third auxiliary sub-pixel Pa3, which are adjacent to each other (e.g., the first auxiliary sub-pixel Pa1 in the first column 1I and the third auxiliary sub-pixel Pa3 in the second column 2I). The plurality of second auxiliary sub-pixels Pa2 may be spaced apart from each other. In addition, at least two of the plurality of second auxiliary sub-pixels Pa2 may share at least one of auxiliary intermediate layers. In this case, one first auxiliary sub-pixel Pa1, one third auxiliary sub-pixel Pa3, and two second auxiliary sub-pixels Pa2 may form a group and be repeatedly arranged in the auxiliary light-emitting area Pg.

Figure 9:
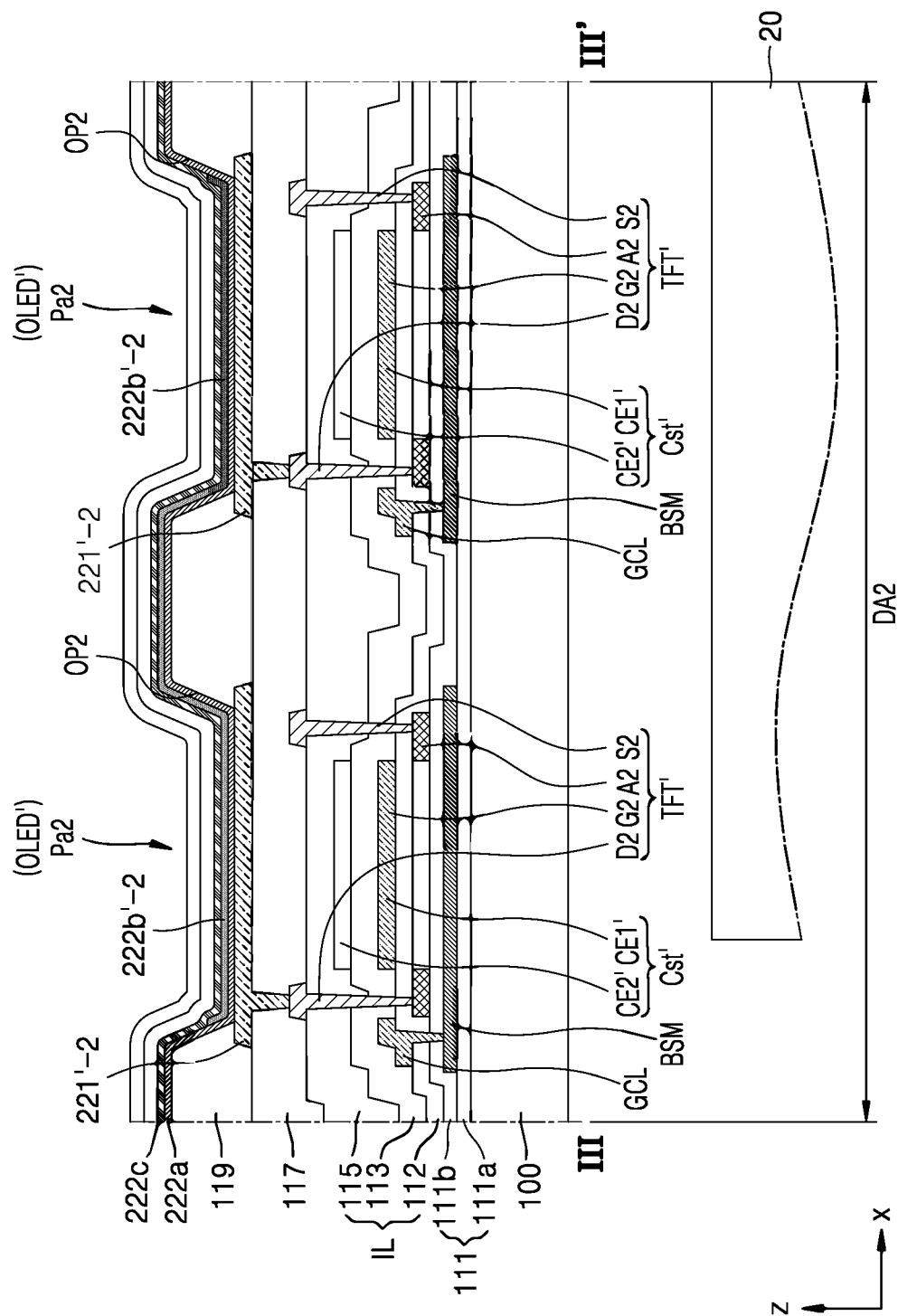
FIG. 9 is a schematic cross-sectional view of a display device taken along the line III-Ill' of FIG. 5.

In one or more embodiments, a second auxiliary intermediate layer of two adjacent second auxiliary sub-pixels Pa2 may be arranged in a first area AR1. In this case, as shown in FIG. 9 to be described below, in the first area AR1, a second auxiliary intermediate layer arranged on a second auxiliary pixel electrode of each of the second auxiliary sub-pixels Pa2 adjacent to each other may be arranged on a pixel-defining layer 119 arranged between second auxiliary pixel electrodes adjacent to each other, and thus may be integrally formed.

In one or more embodiments, the planar area of the first area AR1 may be different from the planar area of the second auxiliary sub-pixel Pa2. For example, the planar area of the first area AR1 may be greater than the planar area of the second auxiliary sub-pixel Pa2. In one or more embodiments, the sum of the planar areas of all the second auxiliary sub-pixels Pa2 arranged in the first area AR1 may be less than the planar area of the first area AR1.

In this case, a first shortest distance d1 between second auxiliary sub-pixels Pa2 adjacent to each other may be reduced. That is, in general, in the case of forming a sub-pixel, an intermediate layer may be formed on a pixel electrode by evaporating a deposition material and depositing the deposition material through a mask assembly. In this case, due to assembly tolerances during fabrication of the mask assembly, deformation of the mask assembly during a deposition process, and the like, the intermediate layer may not be formed according to a designed pattern, and thus, a set or certain interval is required between pixel electrodes adjacent to each other. In this case, there has to be a set or certain distance between auxiliary sub-pixels that implement or provide the same color. However, when the interval between the auxiliary sub-pixels is too great, the size of the auxiliary light-emitting area Pg increases and thus the area of the transmission portion TA is reduced, and thus, the transmittance of the second display area DA2 may decrease. However, when an auxiliary sub-pixel emitting light of a different color is not arranged between auxiliary sub-pixels that implement or provide the same color, as described above, the shortest distance between auxiliary sub-pixels adjacent to each other may be reduced by sharing at least one of intermediate layers.

That is, in general, when forming pixel electrodes, the pixel electrodes may be patterned through photoresist. In this case, the distance between adjacent pixel electrodes may be precisely adjusted. However, as described above, when at least one of the intermediate layers is formed on a plurality of the pixel electrodes through a deposition process, a set or certain interval may be required between the pixel electrodes in order to arrange the intermediate layer over the entire pixel electrodes.

However, in one or more embodiments of the disclosure, by placing auxiliary sub-pixels, which implement or provide the same color, to be adjacent to each other and sharing at least one of auxiliary intermediate layers, the distance between the auxiliary sub-pixels implementing or providing the same color may be reduced.

The first auxiliary sub-pixel Pa1, the second auxiliary sub-pixel Pa2, and the third auxiliary sub-pixel Pa3 may form one auxiliary light-emitting area Pg. In FIG. 5, although eight auxiliary sub-pixels Pa1, Pa2, and Pa3 are included in one auxiliary light-emitting area Pg, the number and arrangement of auxiliary sub-pixels Pa1, Pa2, and Pa3 in one auxiliary light-emitting area Pg may be variously modified in a suitable manner.

The transmission portion TA is an area in which light transmittance is high because no display element is arranged therein. In one or more embodiments, a plurality of transmission portions TA may be provided in the second display area DA2. The transmission portions TA may be alternately arranged with the auxiliary light-emitting area Pg in a first direction (i.e., x direction) and/or a second direction (i.e., y direction). Alternatively, the transmission portions TA may be arranged to surround the auxiliary light-emitting area Pg.

In the second display area DA2, a base unit U in which the auxiliary light-emitting area Pg and the transmission portion TA are bundled may be repeatedly arranged in the x direction and the y direction.

In FIG. 5, the base unit U may have a shape in which one auxiliary light-emitting area Pg and three transmission portions TA arranged around the auxiliary light-emitting area Pg are bundled in a rectangular shape. The base unit U is obtained by partitioning the second display area DA2 into repetitive shapes and does not refer to disconnection of the configuration of the second display area DA2. For example, in one or more embodiments, a transmission portion TA in one base unit U may be integrally formed with a transmission portion TA in a base unit U adjacent to the one base unit U.

In one or more embodiments, in the base unit U, the area of the auxiliary light-emitting area Pg may be less than the area of the transmission portion TA. For example, the area of the auxiliary light-emitting area Pg may be about one third of the area of the transmission portion TA. In other words, the area of the auxiliary light-emitting area Pg may be about one quarter of the area of the base unit U, and the area of the transmission portion TA may be about three quarters of the area of the base unit U.

A corresponding unit U' having an area equal to or substantially equal to the area of the base unit U may be set in the first display area DA1. In this case, the number of main sub-pixels Pm1, Pm2, and Pm3 in a corresponding unit U' may be greater than the number of auxiliary sub-pixels Pa1, Pa2, and Pa3 in the base unit U.

Referring to FIG. 6, a third main sub-pixel Pm3 is arranged in the first display area DA1, and a third auxiliary sub-pixel Pa3 and a transmission portion TA are arranged in the second display area DA2. In this case, the third main sub-pixel Pm3 and the third auxiliary sub-pixel Pa3 may be sub-pixels that emit light of the same color. In one or more embodiments, the third main sub-pixel Pm3 and the third auxiliary sub-pixel Pa3 may implement blue. In other words, the third main sub-pixel Pm3 and the third auxiliary sub-pixel Pa3 may provide a blue light.

A main sub-pixel Pm may include a first thin-film transistor TFT, a main storage capacitor Cst, and a main organic light-emitting diode OLED. The auxiliary sub-pixel Pa may include a second thin-film transistor TFT', an auxiliary storage capacitor Cst', and an auxiliary organic light-emitting diode OLED'. The transmission portion TA may include an opening area TAH to correspond to the transmission portion TA.

A component 20 may be arranged underneath the second display area DA2. The component 20 may be a camera that captures an image or an infrared (IR) sensor that transmits or receives infrared light. Because the transmission portion TA is arranged in the second display area DA2, light transmitted to or received from the component 20 may be transmitted. For example, light emitted from the component 20 may travel in the z direction through the transmission portion TA (e.g., through the transmission portion TA and away from the component 20), and light generated from the outside of the display device and incident on the component 20 may travel in the −z direction through the transmission portion TA (e.g., through the transmission portion TA and toward the component 20). In one or more embodiments, the component 20 may include a plurality of image sensors, and one image sensor may be arranged to correspond to one transmission portion TA.

Hereinafter, a structure in which the components in the display device according to an embodiment are stacked will be described.

A substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), and/or the like. The substrate 100 including polymer resin may be flexible, rollable, and/or bendable. The substrate 100 may have a multi-layered structure including a layer including the aforementioned polymer resin and an inorganic layer.

A buffer layer 111 may be positioned on the substrate 100 and reduce or block infiltration of foreign matter, moisture, or external air from below the substrate 100 and may provide a flat surface on the substrate 100. The buffer layer 111 may include an inorganic material (e.g., oxide or nitride), an organic material, or an organic and inorganic compound, and may be formed as a single layer or multiple layers of an inorganic material and an organic material. A barrier layer may be between the substrate 100 and the buffer layer 111 in order to prevent or reduce infiltration of ambient air. In one or more embodiments, the buffer layer 111 may include silicon oxide ($SiO_2$) and/or silicon nitride ($SiN_x$). The buffer layer 111 may be provided such that a first buffer layer 111a and a second buffer layer 111b are stacked.

In the second display area DA2, a lower electrode layer BSM may be arranged between the first buffer layer 111a and the second buffer layer 111b. In another embodiment, the lower electrode layer BSM may be arranged between the substrate 100 and the first buffer layer 111a. The lower electrode layer BSM may be arranged under a second thin-film transistor TFT' and prevent or reduce deterioration of characteristics of the second thin-film transistor TFT' due to light emitted from the component 20.

In addition, the lower electrode layer BSM may be connected through a contact hole to a wiring line GCL arranged on another layer. The lower electrode layer BSM may receive a constant voltage or a signal from the wiring line GCL. For example, the lower electrode layer BSM may receive a driving voltage ELVDD or a scan signal. The lower electrode layer BSM may significantly reduce the probability of generating an electrostatic discharge in response to receiving the constant voltage or the signal. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The lower electrode layer BSM may include a single layer or multiple layers of the aforementioned materials.

A first thin-film transistor TFT and the second thin-film transistor TFT' may be arranged on the buffer layer 111. The first thin-film transistor TFT includes a first semiconductor layer A1, a first gate electrode G1, a first source electrode S1, and a first drain electrode D1, and the second thin-film transistor TFT' includes a second semiconductor layer A2, a second gate electrode G2, a second source electrode S2, and a second drain electrode D2. The first thin-film transistor TFT may be connected to a main organic light-emitting diode OLED of the first display area DA1 to drive the main organic light-emitting diode OLED. The second thin-film transistor TFT' may be connected to an auxiliary organic light-emitting diode OLED' of the second display area DA2 to drive the auxiliary organic light-emitting diode OLED'.

The first semiconductor layer A1 and the second semiconductor layer A2 are arranged on the buffer layer 111 and may include polysilicon. In another embodiment, the first semiconductor layer A1 and the second semiconductor layer A2 may each include amorphous silicon. In another embodiment, the first semiconductor layer A1 and the second semiconductor layer A2 may each include an oxide of at least one material selected from indium (In), gallium (Ga), stanium (Sn), zirconium (Zr), vanadium (V), hafnium (Hf), cadmium (Cd), germanium (Ge), chromium (Cr), titanium (Ti), or zinc (Zn). The first semiconductor layer A1 and the second semiconductor layer A2 may each include a channel region, and a source region and a drain region doped with impurities.

The second semiconductor layer A2 may overlap the lower electrode layer BSM with the second buffer layer 111$b$ therebetween. In an embodiment, the width of the second semiconductor layer A2 may be less than the width of the lower electrode layer BSM. Thus, when projected in a direction perpendicular to the substrate 100, the second semiconductor layer A2 may overlap the lower electrode layer BSM as a whole. In other words, the second semiconductor layer A2 may overlap the lower electrode layer BSM as a whole when viewed from a plan view.

A first gate insulating layer 112 may be provided to cover the first semiconductor layer A1 and the second semiconductor layer A2. The first gate insulating layer 112 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including the aforementioned inorganic insulating material.

The first gate electrode G1 and the second gate electrode G2 are arranged on the first gate insulating layer 112 so as to overlap the first semiconductor layer A1 and the second semiconductor layer A2, respectively. Each of the first gate electrode G1 and the second gate electrode G2 may include Mo, Al, Cu, Ti, or the like and may include a single layer or multiple layers. For example, the first gate electrode G1 and the second gate electrode G2 may each include a single layer of Mo.

A second gate insulating layer 113 may be provided to cover the first gate electrode G1 and the second gate electrode G2. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_2$. The second gate insulating layer 113 may include a single layer or multiple layers including the aforementioned inorganic insulating material.

A first upper electrode CE2 of the main storage capacitor Cst and a second upper electrode CE2' of the auxiliary storage capacitor Cst' may be arranged on the second gate insulating layer 113.

In the first display area DA1, the first upper electrode CE2 may overlap the first gate electrode G1 thereunder. The first gate electrode G1 and the first upper electrode CE2 overlapping each other with the second gate insulating layer 113 therebetween may form the main storage capacitor Cst. The first gate electrode G1 may be the first lower electrode CE1 of the main storage capacitor Cst.

In the second display area DA2, the second upper electrode CE2' may overlap the second gate electrode G2 thereunder. The second gate electrode G2 and the second upper electrode CE2' overlapping each other with the second gate insulating layer 113 therebetween may form the auxiliary storage capacitor Cst'. The first gate electrode G1 may be the second lower electrode CE1' of the auxiliary storage capacitor Cst'.

Each of the first upper electrode CE2 and the second upper electrode CE2' may include Al, Pt, Pd, Ag, Mg, Au, Ni, Nd, Ir, Cr, Li, Ca, Mo, Ti, W, and/or Cu and may include a single layer or multiple layers of the aforementioned materials.

An interlayer insulating layer 115 may be formed to cover the first upper electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, or $ZnO_2$.

When the first gate insulating layer 112, the second gate insulating layer 113, and the interlayer insulating layer 115 are collectively referred to as an inorganic insulating layer IL, a structure in which the inorganic insulating layer IL is stacked on the substrate 100 may have a transmittance of about 90% or more with respect to an infrared wavelength. For example, light having a wavelength of about 900 nm to about 1100 nm, which passes through the substrate 100 and the inorganic insulating layer IL, may have a transmittance of about 90%.

The first and second source electrodes S1 and S2 and the first and second drain electrodes D1 and D2 are arranged on the interlayer insulating layer 115. The first and second source electrodes S1 and S2 and the first and second drain electrodes D1 and D2 may each include a conductive material including Mo, Al, Cu, Ti, or the like and may be formed as a single layer or multiple layers including the conductive material. For example, the first and second source electrodes S1 and S2 and the first and second drain electrodes D1 and D2 may each have a multi-layered structure of Ti/Al/Ti.

A planarization layer 117 may be arranged to cover the first and second source electrodes S1 and S2 and the first and second drain electrodes D1 and D2. The planarization layer 117 may have a flat upper surface such that a main pixel electrode 221 and an auxiliary pixel electrode 221' arranged thereon are formed flat.

The planarization layer 117 may be formed as a single layer or multiple layers of an organic material. The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, and/or the like.

The planarization layer 117 has an opening that exposes one of the first source electrode S1 and the first drain electrode D1 of the first thin-film transistor TFT, and the main pixel electrode 221 may contact the first source electrode S1 or the first drain electrode D1 through the opening and be connected (e.g., electrically connected) to the first thin-film transistor TFT.

In addition, the planarization layer 117 has an opening that exposes one of the second source electrode S2 and the second drain electrode D2 of the second thin-film transistor TFT', and the auxiliary pixel electrode 221' may contact the second source electrode S2 or the second drain electrode D2 through the opening and be connected (e.g., electrically connected) to the second thin-film transistor TFT'.

The main pixel electrode 221 and the auxiliary pixel electrode 221' may each include a conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the main pixel electrode 221 and the auxiliary pixel electrode 221' may each include a reflective layer including Ag, Mg, Al, Pt, Pd, Au, Ni, Nd, Ir, Cr, or a compound thereof. In another embodiment, the main pixel electrode 221 and the auxiliary pixel electrode 221' may each further include a layer including ITO, IZO, ZnO, or $In_2O_3$ above or below the reflective layer. In one or more embodiments, the main pixel electrode 221 and the auxiliary pixel electrode 221' may each have a stacked structure of ITO/Ag/ITO.

The pixel-defining layer 119 may cover the edge of each of the main pixel electrode 221 and the auxiliary pixel electrode 221'. The pixel-defining layer 119 overlaps each of the main pixel electrode 221 and the auxiliary pixel electrode 221' (e.g., overlaps an edge portion of each of the main pixel electrode 221 and the auxiliary pixel electrode 221' in the z direction), and includes a first opening OP1 and a second opening OP2, which define a light-emitting area of a sub-pixel. The pixel-defining layer 119 increases the distance between the edges of the main and auxiliary pixel electrodes 221 and 221' and an opposite electrode 223 on the main and auxiliary pixel electrodes 221 and 221', thereby preventing or substantially preventing the occurrence of arcs in or at the edges of the main and auxiliary pixel electrodes 221 and 221'. The pixel-defining layer 119 may include an organic insulating material such as polyimide, polyamide, acrylic resin, BCB, HMDSO, or phenol resin and may be formed by spin coating or the like.

When the planarization layer 117 and the pixel-defining layer 119 are collectively referred to as an organic insulating layer OL, the organic insulating layer OL may have a transmittance of about 90% or more with respect to an infrared wavelength. For example, light having a wavelength of about 900 nm to about 1100 nm, which passes through the organic insulating layer OL, may have a transmittance of about 90%.

A main intermediate layer and an auxiliary intermediate layer arranged to correspond to the main pixel electrode 221 and the auxiliary pixel electrode 221' may be included in the first opening OP1 and the second opening OP2 of the pixel-defining layer 119. In this case, the main intermediate layer includes a main emission layer 221b, and the auxiliary intermediate layer is provided with an auxiliary emission layer 222b'. Each of the main emission layer 222b and the auxiliary emission layer 222b' may include a polymer material including a high molecular material or a low molecular material and may emit red light, green light, blue light, or white light.

The main intermediate layer and/or the auxiliary intermediate layer may include an organic functional layer 222e arranged above and/or below the main emission layer 222b and the auxiliary emission layer 222b'. The organic functional layer 222e may include a first functional layer 222a and/or a second functional layer 222c. The first functional layer 222a or the second functional layer 222c may be omitted.

The first functional layer 222a may be arranged under the main emission layer 222b and the auxiliary emission layer 222b'. In this case, in an embodiment, the first functional layer 222a may be patterned to correspond to the transmission portion TA and to correspond to the first opening OP1 and the second opening OP2 like the main emission layer 222b and the auxiliary emission layer 222b' and may be arranged in the first opening OP1, the second opening OP2 and the transmission portion TA. In another embodiment, the first functional layer 222a may be arranged to entirely cover the first display area DA1 and the second display area DA2. In another embodiment, the first functional layer 222a may be patterned to correspond to the first opening OP1 and the second opening OP2 and may be arranged in the first opening OP1 and the second opening OP2 and not to be arranged in the transmission portion TA. In another embodiment, the first functional layer 222a may be arranged to entirely cover the first display area DA1 and cover the second display area DA2 excluding the transmission portion TA. Hereinafter, for convenience of description, a case in which the first functional layer 222a is arranged to entirely cover the first display area DA1 and the second display area DA2 will be described in more detail.

The first functional layer 222a may include a single layer or multiple layers including an organic material. The first functional layer 222a may be a hole transport layer (HTL) having a single layer structure. Alternatively, the first functional layer 222a may include a hole injection layer (HIL) and an HTL. The first functional layer 222a may be integrally formed to correspond to the main sub-pixels Pm and the auxiliary sub-pixels Pa respectively included in the first display area DA1 and the second display area DA2. Accordingly, the first functional layer 222a may correspond to the transmission portion TA.

The second functional layer 222c may be arranged on the main emission layer 222b and the auxiliary emission layer 222b'. In this case, in an embodiment, the second functional layer 222c may be patterned to correspond to the transmission portion TA and to correspond to the first opening OP1 and the second opening OP2 like the main emission layer 222b and the auxiliary emission layer 222b' and may be arranged in the first opening OP1, the second opening OP2 and the transmission portion TA. In another embodiment, the second functional layer 222c may be arranged to entirely cover the first display area DA1 and the second display area DA2. In another embodiment, the second functional layer 222c may be patterned to correspond to the first opening OP1 and the second opening OP2 and may be arranged in the first opening OP1 and the second opening OP2 and not to be arranged in the transmission portion TA. In other words, the second functional layer 222c may be arranged in the first opening OP1 and the second opening OP2 but not in an opening area TAH corresponding to the transmission portion TA. In another embodiment, the second functional layer 222c may be arranged to entirely cover the first display area DA1 and cover the second display area DA2 excluding the transmission portion TA (e.g., an opening area TAH corresponding to the transmission portion TA). Hereinafter, for convenience of description, a case in which the second functional layer 222c is arranged to entirely cover the first display area DA1 and the second display area DA2 will be described in more detail.

The second functional layer 222c may include a single layer or multiple layers including an organic material. The second functional layer 222c may include an electron transport layer (ETL) and/or an electron injection layer (EIL). The second functional layer 222c may be integrally formed to correspond to the main sub-pixels Pm and the auxiliary sub-pixels Pa respectively included in the first display area DA1 and the second display area DA2. Accordingly, the second functional layer 222c may correspond to the transmission portion TA.

The opposite electrode 223 is arranged on the second functional layer 222c. The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the aforementioned material. The opposite electrode 223 may be integrally formed to correspond to the main sub-pixels Pm and the auxiliary sub-pixels Pa respectively included in the first display area DA1 and the second display area DA2.

Layers from the main pixel electrode 221 to the opposite electrode 223, which are formed in the first display area DA1, may form a main organic light-emitting diode OLED. Layers from the auxiliary pixel electrode 221' to the opposite electrode 223, which are formed in the second display area DA2, may form an auxiliary organic light-emitting diode OLED'.

An upper layer 250 including an organic material may be formed on the opposite electrode 223. The upper layer 250 may be a layer provided to protect the opposite electrode 223 and increase light extraction efficiency. The upper layer 250 may include an organic material having a higher refractive index than the opposite electrode 223. Alternatively, the upper layer 250 may be provided by stacking layers having different refractive indices. For example, the upper layer 250 may be provided by sequentially stacking a high refractive index layer, a low refractive index layer, and a high refractive index layer. In this case, the refractive index of the high refractive index layer may be 1.7 or more, and the refractive index of the low refractive index layer may be 1.3 or less.

The upper layer 250 may additionally include LiF. Alternatively, the upper layer 250 may additionally include an inorganic insulating material such as $SiO_2$ or $SiN_x$.

In the present embodiment, the first functional layer 222a, the second functional layer 222c, the opposite electrode 223, and the upper layer 250 may include an opening area TAH corresponding to the transmission portion TA. That is, the first functional layer 222a, the second functional layer 222c, the opposite electrode 223, and the upper layer 250 may respectively have openings corresponding to the transmission portion TA. The openings of the first functional layer 222a, the second functional layer 222c, the opposite electrode 223, and the upper layer 250 may be formed by a laser. In one or more embodiments, the widths of the openings forming the opening area TAH may be substantially the same. For example, the width of the opening of the opposite electrode 223 may be substantially the same as the width of the opening area TAH.

In addition, in the present embodiment, the first functional layer 222a, the second functional layer 222c, and the upper layer 250 may be omitted. In this case, the opening of the opposite electrode 223 may be the opening area TAH.

As used herein, the opening area TAH corresponds to the transmission portion TA may refer to an embodiment where the opening area TAH overlaps the transmission portion TA. In this case, the area of the opening area TAH may be less than the area of a first hole H1 formed in the inorganic insulating layer IL. To this end, in FIG. 6, a width Wt of the opening area TAH is less than a width W1 of the first hole H1, and the width W1 of the first hole H1 may be less than a width W2 of a second hole H2. Here, the area of the opening area TAH and the area of the first hole H1 may be defined as the area of a narrowest portion of the opening.

In one or more embodiments, the first functional layer 222a, the second functional layer 222c, the opposite electrode 223, and the upper layer 250 may be arranged on the sides of the first hole H1, the second hole H2, and a third hole H3. In one or more embodiments, the slopes of the sides of the first hole H1, the second hole H2, and the third hole H3 with respect to the upper surface of the substrate 100 may be gentler than that of the side of the opening area TAH with respect to the upper surface of the substrate 100.

As used herein, formation of the opening area TAH refers to an embodiment where a member such as the opposite electrode 223 is removed from the transmission portion TA, and thus a light transmittance of the transmission portion TA may be significantly increased.

The main organic light-emitting diode OLED and the auxiliary organic light-emitting diode OLED' may be sealed by a thin-film encapsulation layer 300. The thin-film encapsulation layer 300 may be arranged on the upper layer 250. The thin-film encapsulation layer 300 may prevent or substantially prevent external moisture or foreign matter from infiltrating into the main organic light-emitting diode OLED and the auxiliary organic light-emitting diode OLED'.

The thin-film encapsulation layer 300 may include at least one inorganic encapsulation layer and at least one organic encapsulation layer. In this regard, FIG. 6 illustrates a structure in which the thin-film encapsulation layer 300 includes a first inorganic encapsulation layer 310, an organic encapsulation layer 320, and a second inorganic encapsulation layer 330 which are sequentially stacked. In another embodiment, the number of organic encapsulation layers, the number of inorganic encapsulation layers, and the stacking order may be suitably changed.

Each of the first inorganic encapsulation layer 310 and the second inorganic encapsulation layer 330 may include one or more inorganic insulating materials, such as aluminum oxide, titanium oxide, tantalum oxide, hafnium oxide, zinc oxide, silicon oxide, silicon nitride, and/or silicon oxynitride, and may be formed by chemical vapor deposition (CVD). The organic encapsulation layer 320 may include a polymer-based material. Examples of the polymer-based material may include silicon-based resin, acryl-based resin, epoxy-based resin, polyimide, and polyethylene.

The first inorganic encapsulation layer 310, the organic encapsulation layer 320, and the second inorganic encapsulation layer 330 may be integrally formed to cover the display area (corresponding to the auxiliary light-emitting area Pg of the second display area DA2 and the first display area DA1) and a sensor area (corresponding to the transmission portion TA). Accordingly, the first inorganic encapsulation layer 310, the organic encapsulation layer 320, and the second inorganic encapsulation layer 330 may be arranged in the opening area TAH.

In another embodiment, the organic encapsulation layer 320 may be integrally formed to cover the second display area DA2, but may not be in the transmission portion TA. In other words, the organic encapsulation layer 320 may include an opening corresponding to the transmission portion TA. In this case, the first inorganic encapsulation layer 310 and the second inorganic encapsulation layer 330 may contact each other within the opening area TAH.

In the present embodiment, the size of the second opening OP2 defining a light-emitting area EA2 of the third auxiliary sub-pixel Pa3 may be greater than the size of the first opening OP1 defining a light-emitting area EA1 of the third main sub-pixel Pm3. Accordingly, when the same or substantially the same current is supplied to the third auxiliary sub-pixel Pa3 and the third main sub-pixel Pm3, the luminance of the third auxiliary sub-pixel Pa3 may be greater than the luminance of the third main sub-pixel Pm3.

In the second display area DA2, the number of auxiliary sub-pixels per the base unit U is less than the number of main sub-pixels of the corresponding unit U', and as a whole, the luminance implemented in the corresponding unit U' of the first display area DA1 and the luminance implemented in the base unit U of the second display area DA2 may be the same or substantially the same. Accordingly, in one or more embodiments, the luminance of the third auxiliary sub-pixel Pa3 may be greater than the luminance of the third main sub-pixel Pm3 and the luminance implemented in the corresponding unit U' of the first display area DA1 and the luminance implemented in the base unit U of the second display area DA2 may be the same or substantially the same.

Figure 7:
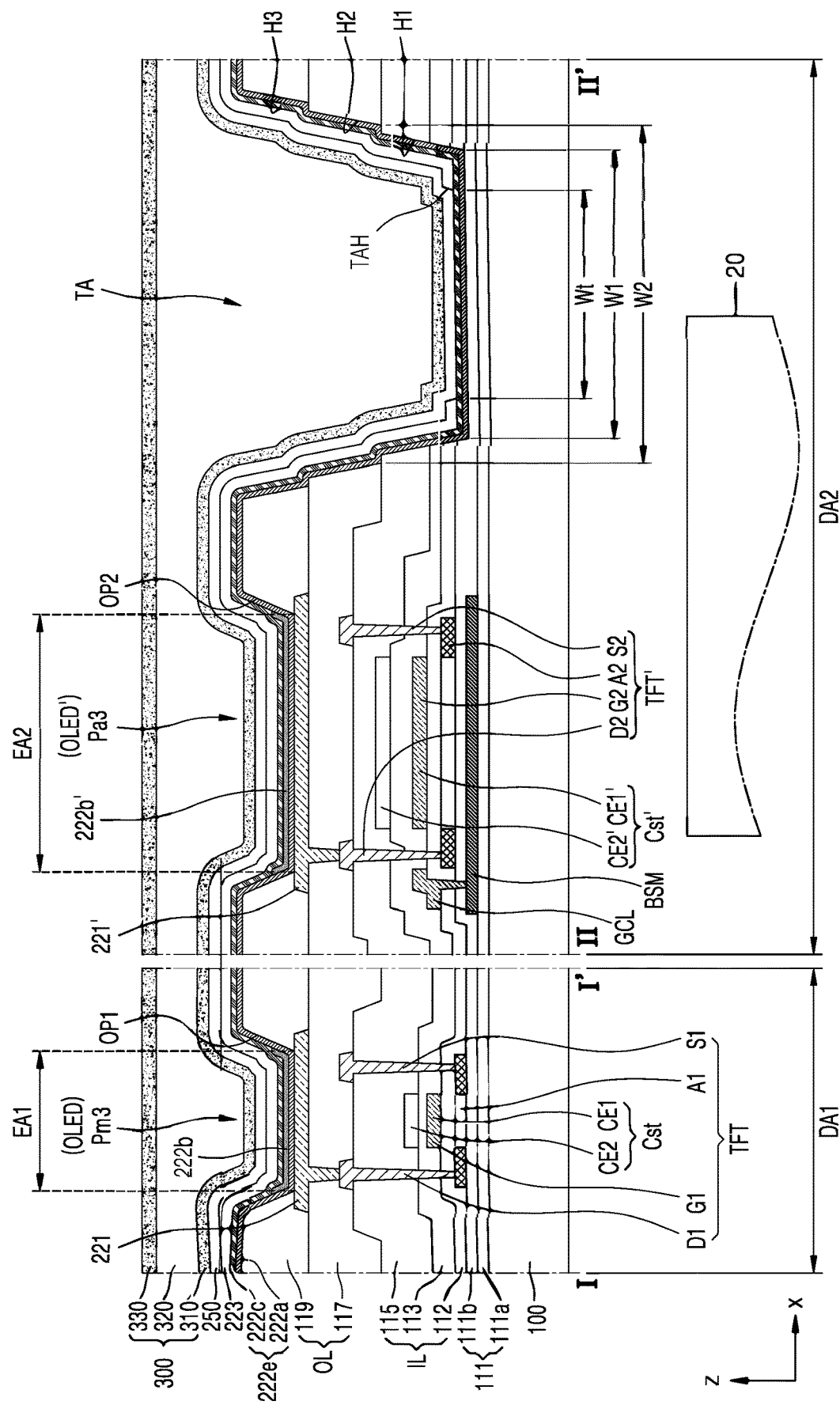
FIG. 7 is a schematic cross-sectional view of a display device according to another embodiment.

FIG. 7 is a schematic cross-sectional view of a display device according to an embodiment. In FIG. 7, the same reference numerals as those in FIG. 6 denote the same members, and repeated descriptions thereof are omitted.

Referring to FIG. 7, the display device includes a first display area DA1 in which a main sub-pixel Pm is arranged, and a second display area DA2 in which an auxiliary light-emitting area including an auxiliary sub-pixel Pa and a transmission portion TA are arranged. A light-emitting area EA2 of the auxiliary sub-pixel Pa is greater than a light-emitting area EA1 of a main sub-pixel Pm. Also, in the display device according to the embodiment, the pixel arrangement structure of main sub-pixels Pm are different from the pixel arrangement structure of auxiliary sub-pixels Pa.

In the present embodiment, at least one of a first functional layer 222a, a second functional layer 222c, or an upper layer 250 may be arranged to correspond to the transmission portion TA. That is, at least one of the first functional layer 222a, the second functional layer 222c, or the upper layer 250 may be arranged in an opening area TAH.

An opposite electrode 223 has an opening corresponding to the transmission portion TA, and the width of the opening may be substantially equal to the width of the opening area TAH. In this case, the opposite electrode 223 may be formed by using a mask provided with a covering layer that covers the transmission portion TA.

In another embodiment, after the opposite electrode 223 is formed on the whole surface of the substrate 100, an opening may be formed in the opposite electrode 223 by removing a portion of the opposite electrode 223 corresponding to the transmission portion TA with a laser.

Figure 8:
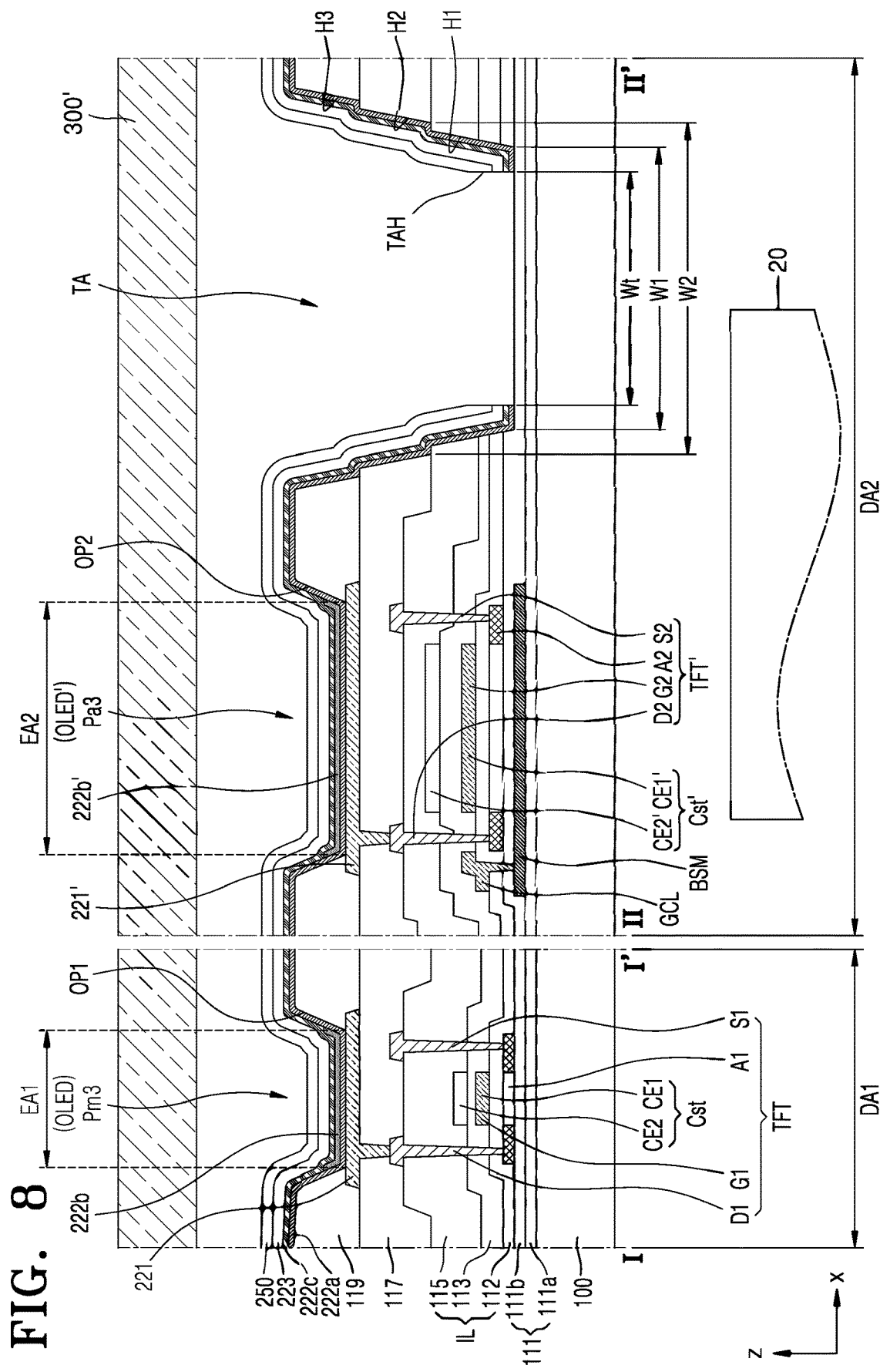
FIG. 8 is a schematic cross-sectional view of a display device according to an embodiment.

FIG. 8 is a schematic cross-sectional view of a display device according to an embodiment. In FIG. 8, the same reference numerals as those in FIG. 6 denote the same members, and repeated descriptions thereof are omitted.

Referring to FIG. 8, the display device includes a first display area DA1 in which a main sub-pixel Pm is arranged, and a second display area DA2 in which an auxiliary sub-pixel Pa and a transmission portion TA are arranged. A light-emitting area EA2 of the auxiliary sub-pixel Pa is greater than a light-emitting area EA1 of a main sub-pixel Pm. Also, in the display device according to the embodiment, the pixel arrangement structure of main sub-pixels Pm are different from the pixel arrangement structure of auxiliary sub-pixels Pa.

In the present embodiment, a main organic light-emitting diode OLED and an auxiliary organic light-emitting diode OLED' may be covered with an encapsulation substrate 300'. The encapsulation substrate 300' includes a transparent material. For example, the encapsulation substrate 300' may include a glass material. Alternatively, the encapsulation substrate 300' may include polymer resin and/or the like. The encapsulation substrate 300' may prevent or substantially prevent external moisture or foreign matter from penetrating into the main organic light-emitting diode OLED and the auxiliary organic light-emitting diode OLED'.

A sealing material such as a sealant may be arranged between a substrate 100, on which the main organic light-emitting diode OLED and the auxiliary organic light-emitting diode OLED' are formed, and the encapsulation substrate 300'. The sealing material may block or substantially block external moisture or foreign matter that may penetrate through between the substrate 100 and the encapsulation substrate 300'.

FIG. 9 is a schematic cross-sectional view of a display device taken along the line III-Ill' of FIG. 5.

Referring to FIG. 9, at least two of a plurality of auxiliary sub-pixels arranged in an auxiliary light-emitting area may emit light of the same color. For example, at least two first auxiliary sub-pixels, at least two second auxiliary sub-pixels Pa2, and/or at least two third auxiliary sub-pixels may be arranged in the auxiliary light-emitting area.

In this case, when, between auxiliary sub-pixels, which emit light of the same color and are adjacent to each other, from among the plurality of auxiliary sub-pixels, there is no auxiliary sub-pixel emitting light of a color different from the same color, the auxiliary sub-pixels, which emit light of the same color and are adjacent to each other, may share at least one of intermediate layers. In other words, when two adjacent auxiliary sub-pixels emit light of the same color and an auxiliary sub-pixel emitting light of a different color is not located between the two adjacent auxiliary sub-pixels, the two adjacent auxiliary sub-pixels may share at least one intermediate layer with each other. Specifically, when the auxiliary sub-pixel emitting light of a color different from the same color is not arranged between the auxiliary sub-pixels which emit light of the same color and are adjacent to each other, the auxiliary sub-pixels which emit light of the same color and are adjacent to each other may share an organic function layer and/or the auxiliary emission layer. Hereinafter, for convenience of description, a case in which each of the auxiliary sub-pixels sharing at least one of the auxiliary intermediate layers is a second auxiliary sub-pixel Pa2 will be described in more detail below. In addition, a case in which at least one of second auxiliary intermediate layers shared by the second auxiliary sub-pixel Pa2 is a second auxiliary emission layer 222b'-2 will be described in more detail below.

For example, as illustrated in FIG. 5, when the first auxiliary sub-pixel Pa1 and/or the third auxiliary sub-pixel Pa3 are not arranged between second auxiliary sub-pixels Pa2 adjacent to each other, the second auxiliary sub-pixels Pa2 adjacent to each other may share a second auxiliary emission layer 222b'-2 with each other. In this case, the second auxiliary emission layer 222b'-2 shared by the adjacent second auxiliary sub-pixels Pa2 may be disconnected without being shared by the first auxiliary sub-pixel Pa1, the third auxiliary sub-pixel Pa3, and the main sub-pixel. That is, second auxiliary sub-pixels Pa2 adjacent to each other based on FIG. 9 may share the second auxiliary emission layer 222b'-2, and the first auxiliary sub-pixel Pa1, the third auxiliary sub-pixel Pa3, and the main sub-pixel may not share the second auxiliary emission layer 222b'-2.

In this case, the second auxiliary emission layer 222b'-2 may be integrally formed on a second auxiliary pixel electrode 221'-2 of one of the second auxiliary sub-pixels Pa2 adjacent to each other, a pixel-defining layer 119 arranged between second auxiliary pixel electrodes 221'-2 of the second auxiliary sub-pixels Pa2 adjacent to each other, and a second auxiliary pixel electrode 221'-2 of the other of the second auxiliary sub-pixels Pa2 adjacent to each other, as described above.

In this case, even if the second auxiliary emission layers 222b'-2 are deposited on the substrate 100 through evaporation (or vaporization), the second auxiliary emission layers 222b'-2 are not separately deposited in a pattern form on the second auxiliary pixel electrodes 221'-2 spaced apart from each other, and thus, the interval between the second auxiliary pixel electrodes 221'-2 adjacent to each other may be reduced.

In a general case, one second auxiliary emission layer may be arranged to correspond to and be spaced apart from one second auxiliary pixel electrode. In this case, in order to arrange each second auxiliary emission layer to correspond to each second auxiliary pixel electrode, the second auxiliary pixel electrodes adjacent to each other have to be sufficiently spaced apart from each other. In this case, because the second auxiliary pixel electrodes adjacent to each other have to be spaced apart from each other by a minimum distance, there is a limit in reducing the size of the auxiliary light-emitting area.

However, in one or more embodiments of the disclosure, as the shortest distance between the second auxiliary pixel electrodes 221'-2 adjacent to each other is reduced, the shortest distance between light-emitting areas of the second auxiliary sub-pixel Pa2 defined by an opening of the pixel-defining layer 119 may be reduced. In this case, the shortest distance between the second auxiliary pixel electrodes 221'-2 is the smallest of the distances between portions of second auxiliary pixel electrodes 221'-2 facing each other from among the second auxiliary pixel electrodes 221'-2 adjacent to each other.

Figure 10:
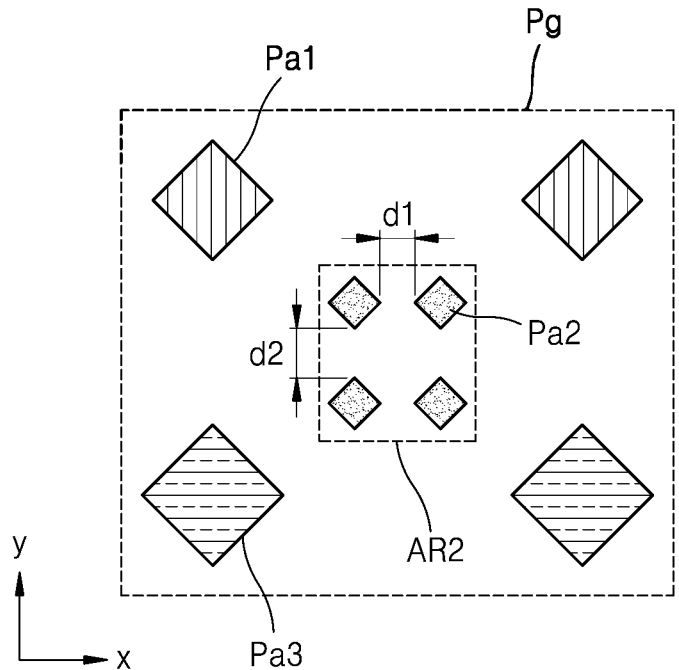
FIG. 10 is a schematic plan view of an arrangement of auxiliary sub-pixels arranged in a second display area according to another embodiment.

FIG. 10 is a schematic plan view of an arrangement of auxiliary sub-pixels Pa1, Pa2 and Pa3 arranged in a second display area according to another embodiment.

Referring to FIG. 10, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. A plurality of first auxiliary sub-pixels Pa1 and a plurality of third auxiliary sub-pixels Pa3 may be provided. The plurality of first auxiliary sub-pixels Pa1 and the plurality of third auxiliary sub-pixels Pa3 may be arranged in a first direction (e.g., the x direction in FIG. 10). Furthermore, at least one of the plurality of first auxiliary sub-pixels Pa1 and at least one of the plurality of third auxiliary sub-pixels Pa3 may be arranged in a second direction (e.g., the y direction in FIG. 10). In this case, a plurality of second auxiliary sub-pixels Pa2 may be arranged between (e.g., between in the x direction and/or the y direction) the plurality of first auxiliary sub-pixels Pa1 and the plurality of third auxiliary sub-pixels Pa3.

The plurality of second auxiliary sub-pixels Pa2 may share a second auxiliary intermediate layer with each other. That is, a second auxiliary intermediate layer formed integrally may be arranged on second auxiliary pixel electrodes of second auxiliary sub-pixels Pa2 spaced apart from each other. The second auxiliary intermediate layer may be arranged in a second area AR2 on the plurality of second auxiliary sub-pixels Pa2. In this case, the plurality of second auxiliary sub-pixels Pa2 may be arranged in the second area AR2.

In this case, a first shortest distance d1 between second auxiliary sub-pixels Pa2 that are arranged in the first direction and are adjacent to each other may be reduced as described above. In addition, a second shortest distance d2 between second auxiliary sub-pixels Pa2 that are arranged in the second direction and are adjacent to each other may be reduced because at least one of the second auxiliary intermediate layers does not need to be patterned to correspond to each second auxiliary sub-pixel Pa2, respectively. In this case, the first shortest distance d1 and the second shortest distance d2 may be less than the shortest distance between the second auxiliary sub-pixel Pa2 and the first auxiliary sub-pixel Pa1 and the shortest distance between the second auxiliary sub-pixel Pa2 and the third auxiliary sub-pixel Pa3. In this case, the shortest distance may be the smallest distance among straight distances from the outer side of one of auxiliary sub-pixels adjacent to each other to the outer side of the other of the auxiliary sub-pixels adjacent to each other.

Figure 11:
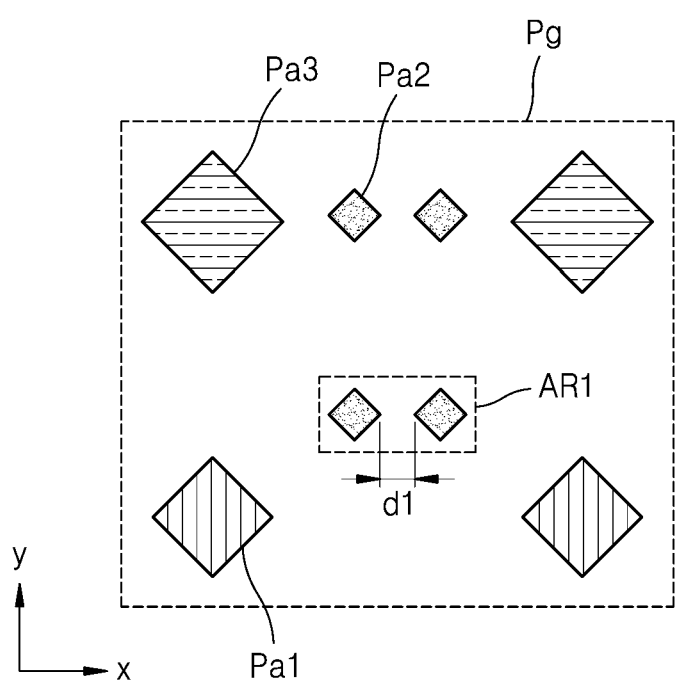
FIG. 11 is a schematic plan view of an arrangement of auxiliary sub-pixels arranged in a second display area according to another embodiment.

FIG. 11 is a schematic plan view of an arrangement of auxiliary sub-pixels Pa1, Pa2 and Pa3 arranged in a second display area according to another embodiment.

Referring to FIG. 11, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively.

In this case, a plurality of third auxiliary sub-pixels Pa3 may be arranged in a line in a first direction (e.g., the x direction in FIG. 11), and a plurality of first auxiliary sub-pixels Pa1 may be arranged in a line in the first direction. In addition, some of the plurality of first auxiliary sub-pixels Pa1 and some of the plurality of third auxiliary sub-pixels Pa3 may be arranged in a line in a second direction (e.g., the y direction in FIG. 11). For example, based on FIG. 11, one first auxiliary sub-pixel Pa1 and one third auxiliary sub-pixel Pa3 may be arranged in a line in the second direction. In this case, a plurality of second auxiliary sub-pixels Pa2 may be arranged between first auxiliary sub-pixels Pa1 adjacent to each other and between third auxiliary sub-pixels Pa3 adjacent to each other. In one or more embodiments, two second auxiliary sub-pixels Pa2 may be arranged in a line in a first direction between two third auxiliary sub-pixels Pa3 arranged in the line in the first direction.

In this case, a plurality of second auxiliary sub-pixels Pa2 adjacent to each other may share at least one of second auxiliary intermediate layers. In particular, a plurality of second auxiliary sub-pixels Pa2 adjacent to each other may share a second auxiliary emission layer arranged in the entirety of a first area AR1. In this case, the second auxiliary emission layer may completely shield the first area AR1.

Figure 12:
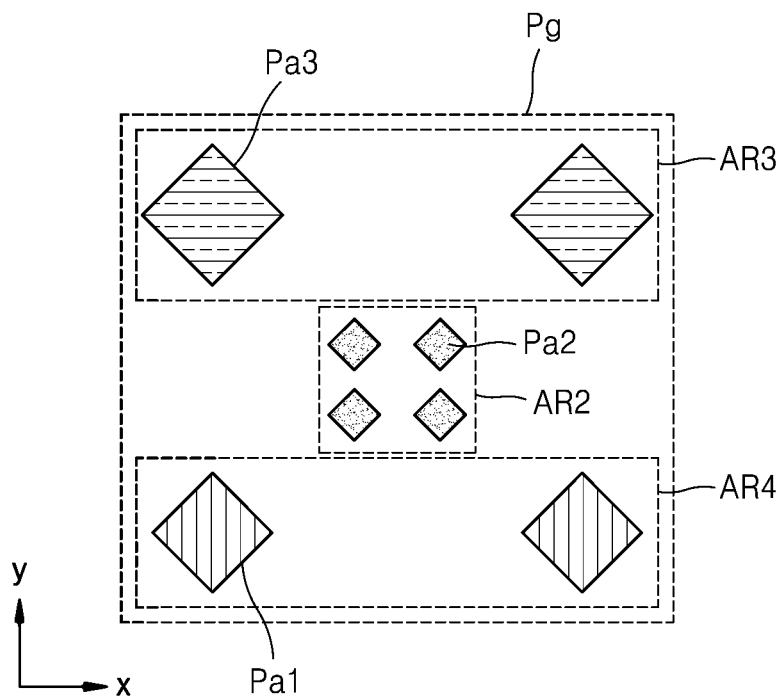
FIG. 12 is a schematic plan view of an arrangement of auxiliary sub-pixels arranged in a second display area according to another embodiment.

FIG. 12 is a schematic plan view of an arrangement of auxiliary sub-pixels Pa1, Pa2 and Pa3 arranged in a second display area according to another embodiment.

Referring to FIG. 12, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively.

The first auxiliary sub-pixel Pa1 and the third auxiliary sub-pixel Pa3 may be arranged in the same manner as illustrated in FIG. 11. A plurality of second auxiliary sub-pixels Pa2 may be arranged between the first auxiliary sub-pixel Pa1 and the third auxiliary sub-pixel Pa3. In this case, the first auxiliary sub-pixel Pa1 and the third auxiliary sub-pixel Pa3 may be arranged to surround a plurality of second auxiliary sub-pixels Pa2. In this case, the plurality of second auxiliary sub-pixels Pa2 may be arranged in the middle of the auxiliary light-emitting area Pg.

A plurality of first auxiliary sub-pixels Pa1 arranged in a line in a first direction (e.g., the x direction in FIG. 12) may share at least one of first auxiliary intermediate layers. A plurality of third auxiliary sub-pixels Pa3 arranged in a line in a first direction (e.g., the x direction in FIG. 12) may share at least one of third auxiliary intermediate layers. A plurality of second auxiliary sub-pixels Pa2 may share at least one of second auxiliary intermediate layers. In one or more embodiments, the plurality of second auxiliary sub-pixels Pa2 are not arranged in the line including the plurality of first auxiliary sub-pixels Pa1 or the line including the plurality of third auxiliary sub-pixels Pa3.

In this case, at least one of the third auxiliary intermediate layers may be arranged in the entirety of a third area AR3 to include a plurality of third auxiliary sub-pixels Pa3. At least one of the first auxiliary intermediate layers may be arranged in the entirety of a fourth area AR4 to include a plurality of first auxiliary sub-pixels Pa1.

In addition, at least one of the second auxiliary intermediate layers may be arranged in the entirety of a second area AR2 to include a plurality of second auxiliary sub-pixels Pa2.

In this case, the shortest distance between first auxiliary sub-pixels Pa1 adjacent to each other, the first shortest distance and the second shortest distance between second auxiliary sub-pixels Pa2, and the shortest distance between third auxiliary sub-pixels Pa3 may be reduced, and thus, an area occupied by the auxiliary sub-pixels Pa1, Pa2, and Pa3 in the auxiliary light-emitting area Pg may be reduced. In this case, by reducing the area of the auxiliary light-emitting area Pg, an area occupied by a transmission portion in a base unit may be increased.

Accordingly, in the display device, the transmittance of the second display area may be improved by securing the area of the transmission portion TA to be as large as possible.

Figure 13:
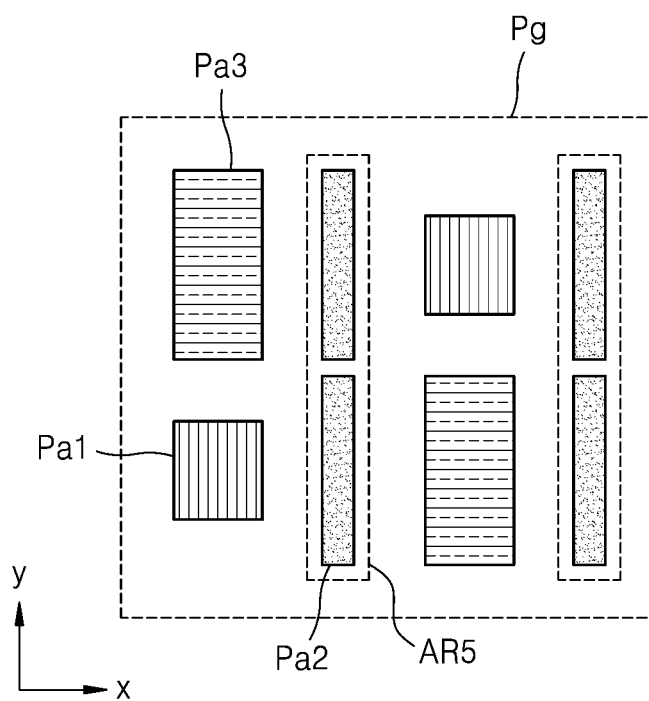
FIG. 13 is a schematic plan view of an arrangement of auxiliary sub-pixels arranged in a second display area according to another embodiment.

FIG. 13 is a schematic plan view of an arrangement of auxiliary sub-pixels Pa1, Pa2 and Pa3 arranged in a second display area according to another embodiment.

Referring to FIG. 13, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape.

In this case, the first auxiliary sub-pixel Pa1 and the third auxiliary sub-pixel Pa3 may be arranged in a first direction (e.g., the x direction in FIG. 13) and a second direction (e.g., they direction in FIG. 13). In this case, the first auxiliary sub-pixel Pa1 and the third auxiliary sub-pixel Pa3 may each have a stripe shape. In one or more embodiments, the first auxiliary sub-pixel Pa1 and the third auxiliary sub-pixel Pa3 may be arranged in a line in the second direction.

At least two of a plurality of second auxiliary sub-pixels Pa2 may be arranged adjacent to or to face the side surfaces of the first auxiliary sub-pixel Pa1 and the third auxiliary sub-pixel Pa3 arranged in the second direction. In this case, at least two of the plurality of second auxiliary sub-pixels Pa2 may be arranged in a line in the second direction.

The plurality of second auxiliary sub-pixels Pa2 arranged in a line may share at least one of second auxiliary intermediate layers. In this case, at least one of the second auxiliary intermediate layers placed in the plurality of second auxiliary sub-pixels Pa2 arranged in a line may not be arranged on the first auxiliary sub-pixel Pa1, the third auxiliary sub-pixel Pa3, and/or a main sub-pixel.

In this case, the shortest distance between second auxiliary sub-pixels Pa2 adjacent to each other may be reduced. In particular, because it is not necessary to arrange at least one of the second auxiliary intermediate layers spaced apart from each other in second auxiliary sub-pixels Pa2 spaced apart from each other, the separation distance between the second auxiliary sub-pixels Pa2 may be reduced. Thus, in the display device, the transmission area of the second display area may be maximized or increased by maximizing or increasing the area of the transmission portion TA.

Figure 14:
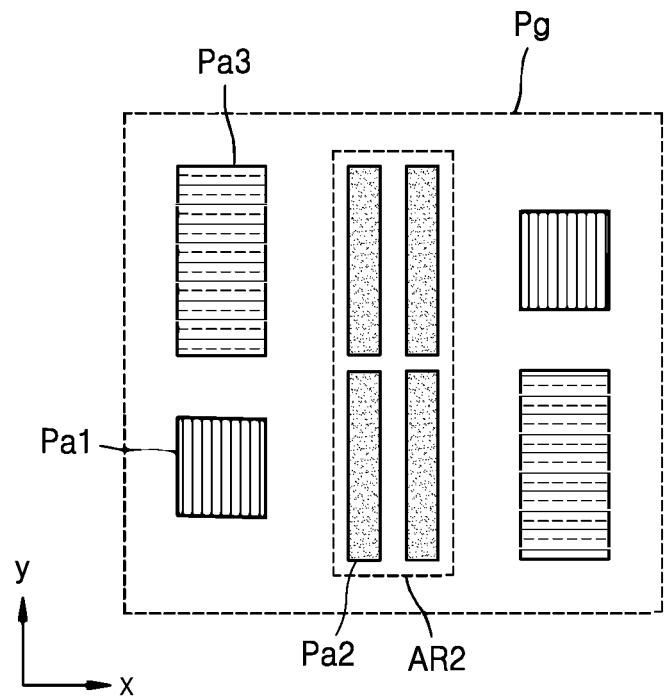
FIG. 14 is a schematic plan view of an arrangement of auxiliary sub-pixels arranged in a second display area according to another embodiment.

FIG. 14 is a schematic plan view of an arrangement of auxiliary sub-pixels Pa1, Pa2 and Pa3 arranged in a second display area according to another embodiment.

Referring to FIG. 14, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the first auxiliary sub-pixel Pa1 and the third auxiliary sub-pixel Pa3 may be arranged in the same manner as illustrated in FIG. 13.

A plurality of second auxiliary sub-pixels Pa2 may be arranged between the first auxiliary sub-pixel Pa1 and the third auxiliary sub-pixel Pa3 (e.g., the first auxiliary sub-pixel Pa1 and the third auxiliary sub-pixel Pa3 in a line in the first direction or x direction in FIG. 14). In one or more embodiments, the first auxiliary sub-pixel Pa1 and the third auxiliary sub-pixel Pa3 may be arranged to surround a plurality of second auxiliary sub-pixels Pa2.

A plurality of second auxiliary sub-pixels Pa2 arranged in the auxiliary light-emitting area Pg may share at least one of second auxiliary intermediate layers. In particular, the plurality of second auxiliary sub-pixels Pa2 may share one second auxiliary emission layer. In this case, light-emitting areas of a plurality of second auxiliary sub-pixels Pa2 may be arranged in a second area AR2 in which the second auxiliary emission layer is arranged on a plane. In this case, the second auxiliary emission layer may be arranged on a second auxiliary pixel electrode of each second auxiliary sub-pixel Pa2.

In this case, the interval between second auxiliary sub-pixels Pa2 spaced apart from each other may be reduced. In this case, by reducing the area of the auxiliary light-emitting area Pg than when separately forming second auxiliary emission layers spaced apart from each other so as to respectively correspond to each second auxiliary sub-pixel Pa2, the area of the transmission portion TA may be increased, thereby increasing the transmittance of the second display area.

Figure 15:
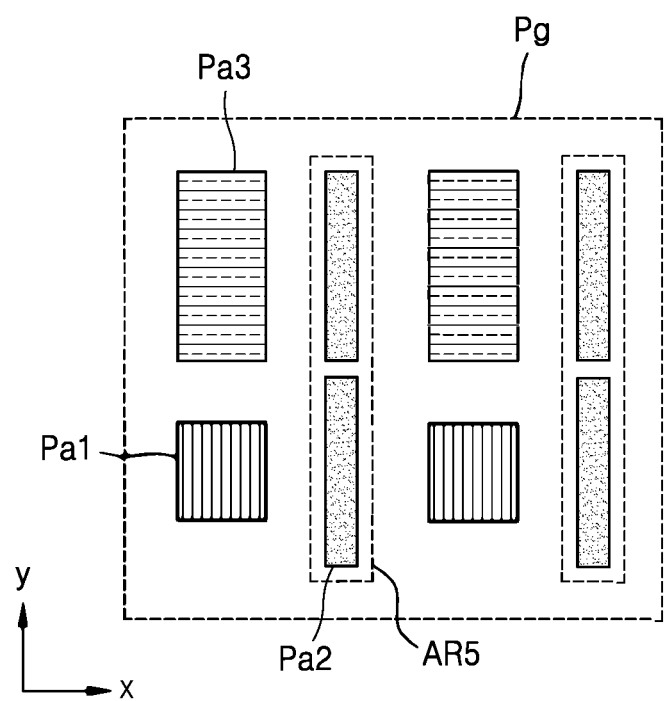
FIG. 15 is a schematic plan view of an arrangement of auxiliary sub-pixels arranged in a second display area according to another embodiment.

FIG. 15 is a schematic plan view of an arrangement of auxiliary sub-pixels Pa1, Pa2 and Pa3 arranged in a second display area according to another embodiment.

Referring to FIG. 15, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the second auxiliary sub-pixel Pa2 may be arranged in the same manner as illustrated in FIG. 13.

In this case, a plurality of first auxiliary sub-pixels Pa1 may be arranged in a line in a first direction (e.g., the x direction in FIG. 15). In addition, a plurality of third auxiliary sub-pixels Pa3 may be arranged in a line in the first direction. Some of the plurality of first auxiliary sub-pixels Pa1 and some of the plurality of third auxiliary sub-pixels Pa3 may be arranged in a line in a second direction (e.g., the y direction in FIG. 15).

In this case, some of the plurality of second auxiliary sub-pixels Pa2 arranged in a line in the second direction may share at least one of second auxiliary intermediate layers arranged in a fifth area AR5. The distance between a plurality of second auxiliary sub-pixels Pa2 sharing at least one of the second auxiliary intermediate layers may be reduced because the distance between second auxiliary pixel electrodes may be adjusted or reduced (e.g., to increase the area of the transmission portion TA).

Figure 16:
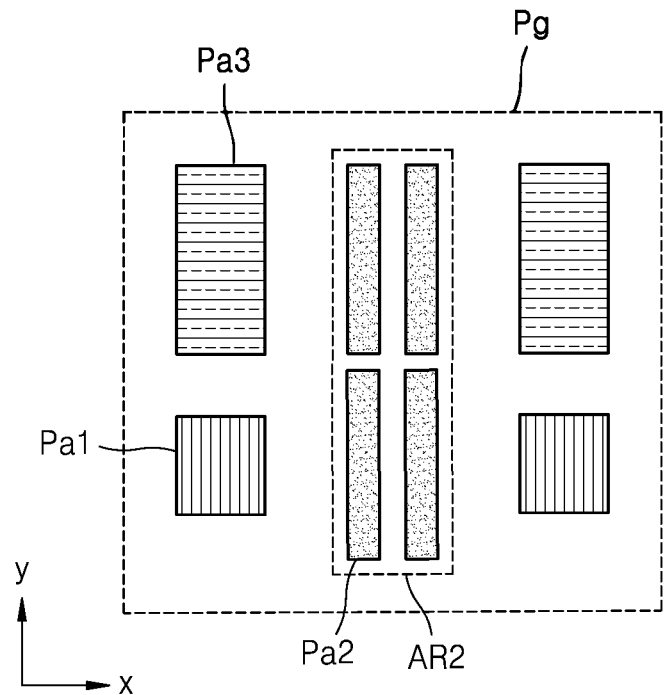
FIG. 16 is a schematic plan view of an arrangement of auxiliary sub-pixels arranged in a second display area according to another embodiment.

FIG. 16 is a schematic plan view of an arrangement of auxiliary sub-pixels Pa1, Pa2 and Pa3 arranged in a second display area according to another embodiment.

Referring to FIG. 16, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the first auxiliary sub-pixel Pa1 and the third auxiliary sub-pixel Pa3 may be arranged in the same manner as illustrated in FIG. 15, and the second auxiliary sub-pixel Pa2 may be arranged in the same manner as illustrated in FIG. 14.

In this case, a plurality of second auxiliary sub-pixels Pa2 may share at least one of second auxiliary intermediate layers. In this case, at least one of the second auxiliary intermediate layers may be arranged in a second area AR2, and a light-emitting area of each second auxiliary sub-pixel Pa2 may be arranged in the second area AR2.

In this case, it is possible to design second auxiliary sub-pixels Pa2 adjacent to each other as close as possible, thereby reducing the size of the auxiliary light-emitting area Pg. In addition, because the area of the transmission portion TA may be secured as large as possible, the transmittance of the second display area may be increased.

Figure 17:
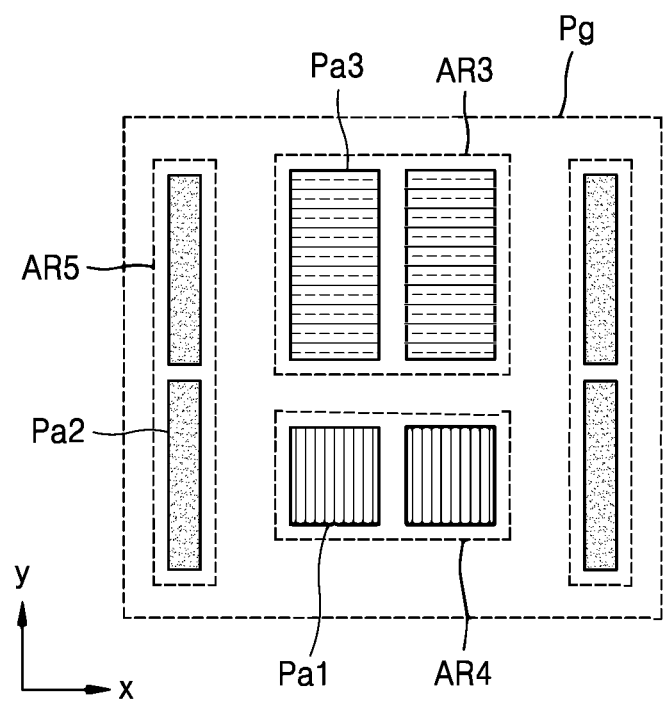
FIG. 17 is a schematic plan view of an arrangement of auxiliary sub-pixels arranged in a second display area according to another embodiment.

FIG. 17 is a schematic plan view of an arrangement of auxiliary sub-pixels Pa1, Pa2 and Pa3 arranged in a second display area according to another embodiment.

Referring to FIG. 17, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the second auxiliary sub-pixel Pa2 may be arranged in the same manner as illustrated in FIG. 13. In addition, the first auxiliary sub-pixel Pa1 and the third auxiliary sub-pixel Pa3 may be arranged similarly as illustrated in FIG. 16.

The first auxiliary sub-pixel Pa1 and the third auxiliary sub-pixel Pa3 may be arranged between second auxiliary sub-pixels Pa2. In this case, the second auxiliary sub-pixel Pa2 may be arranged in a peripheral portion of the auxiliary light-emitting area Pg, and the first auxiliary sub-pixel Pa1 and the third auxiliary sub-pixel Pa3 may be arranged in a central portion of the auxiliary light-emitting area Pg.

In this case, a plurality of third auxiliary sub-pixels Pa3 may share at least one of third auxiliary intermediate layers arranged in a third area AR3. In this case, a light-emitting area of each third auxiliary sub-pixel Pa3 may be arranged in the third area AR3.

A plurality of first auxiliary sub-pixels Pa1 may share at least one of first auxiliary intermediate layers arranged in a fourth area AR4. In this case, a light-emitting area of each first auxiliary sub-pixel Pa1 may be arranged in the fourth area AR4.

In this case, as first auxiliary sub-pixels Pa1 adjacent to each other share one auxiliary intermediate layer, second auxiliary sub-pixels Pa2 adjacent to each other share one auxiliary intermediate layer, and third auxiliary sub-pixel Pa3 adjacent to each other share one auxiliary intermediate layer, the distance between auxiliary sub-pixels may be reduced.

In this case, as described above, the area of the auxiliary light-emitting area Pg may be reduced, and the area of the transmission portion TA may be increased.

Figure 18:
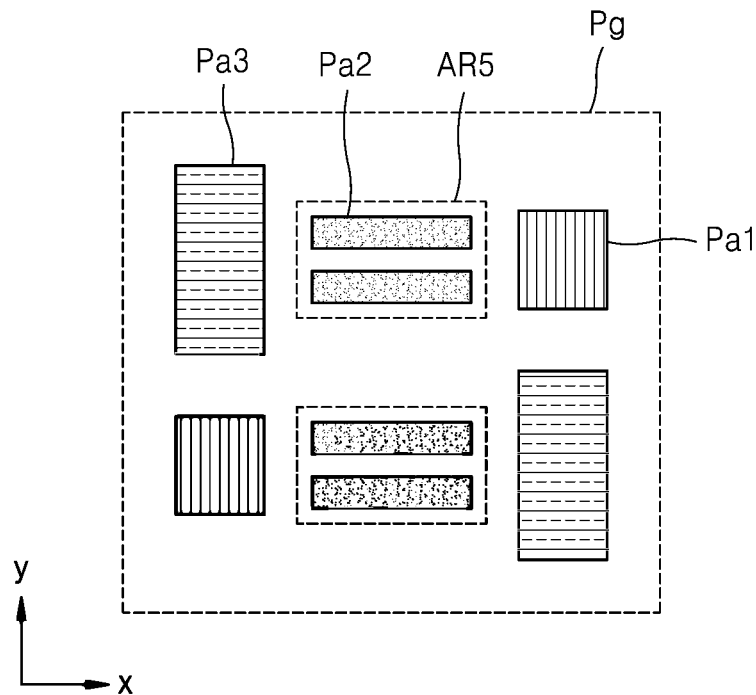
FIG. 18 is a schematic plan view of an arrangement of auxiliary sub-pixels arranged in a second display area according to another embodiment.

FIG. 18 is a schematic plan view of an arrangement of auxiliary sub-pixels Pa1, Pa2, Pa3 arranged in a second display area according to another embodiment.

Referring to FIG. 18, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the first auxiliary sub-pixel Pa1 and the third auxiliary sub-pixel Pa3 may be arranged in the same manner as illustrated in FIG. 13.

Each second auxiliary sub-pixel Pa2 may be arranged between the first auxiliary sub-pixel Pa1 and the third auxiliary sub-pixel Pa3. In this case, the length direction of the third auxiliary sub-pixel Pa3 and the length direction of the second auxiliary sub-pixel Pa2 may be different from each other. For example, the third auxiliary sub-pixel Pa3 may be formed to be long in a second direction (e.g., the y direction in FIG. 18), and the second auxiliary sub-pixel Pa2 may be formed to be long in a first direction (e.g., the x direction in FIG. 18). In other words, the third auxiliary sub-pixel Pa3 may have a short side and a long side where the long side extends in a second direction (e.g., a y direction) and the second auxiliary sub-pixel Pa2 may have a short side and a long side where the long side of the second auxiliary sub-pixel Pa2 extends in a first direction (e.g., an x direction) crossing the second direction.

In this case, some of the plurality of second auxiliary sub-pixels Pa2 may share at least one of second auxiliary intermediate layers arranged in a fifth area AR5. In addition, some of the plurality of second auxiliary sub-pixels Pa2 may share at least one of second auxiliary intermediate layers arranged in an area different from the fifth area AR5.

Accordingly, in the display device, the transmittance of the second display area may be increased by reducing the distance between auxiliary sub-pixels, which emit light of the same color and are adjacent to each other, from among the plurality of auxiliary sub-pixels Pa1, Pa2, and Pa3.

Figure 19:
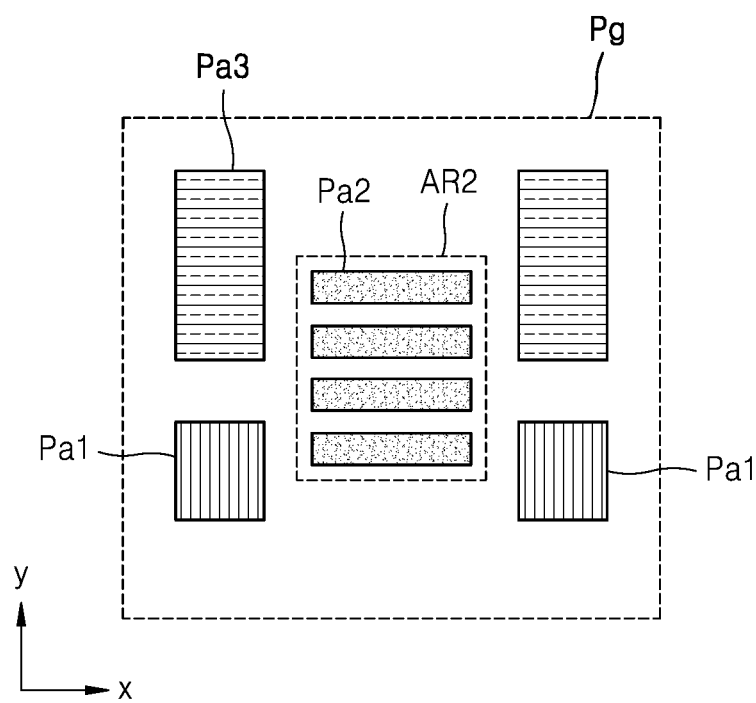
FIG. 19 is a schematic plan view of an arrangement of auxiliary sub-pixels arranged in a second display area according to another embodiment.

FIG. 19 is a schematic plan view of an arrangement of auxiliary sub-pixels Pa1, Pa2, Pa3 arranged in a second display area according to another embodiment.

Referring to FIG. 19, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the first auxiliary sub-pixel Pa1 and the third auxiliary sub-pixel Pa3 may be arranged in the same manner as illustrated in FIG. 15, and the second auxiliary sub-pixel Pa2 may be arranged in the same manner as illustrated in FIG. 18.

In this case, a plurality of second auxiliary sub-pixels Pa2 may share at least one of second auxiliary intermediate layers arranged in a second area AR2. In this case, an interval between the plurality of second auxiliary sub-pixels Pa2 sharing at least one of the second auxiliary intermediate layers may be reduced.

Thus, the transmittance of the second display area of the display device may be improved.

Figure 20:
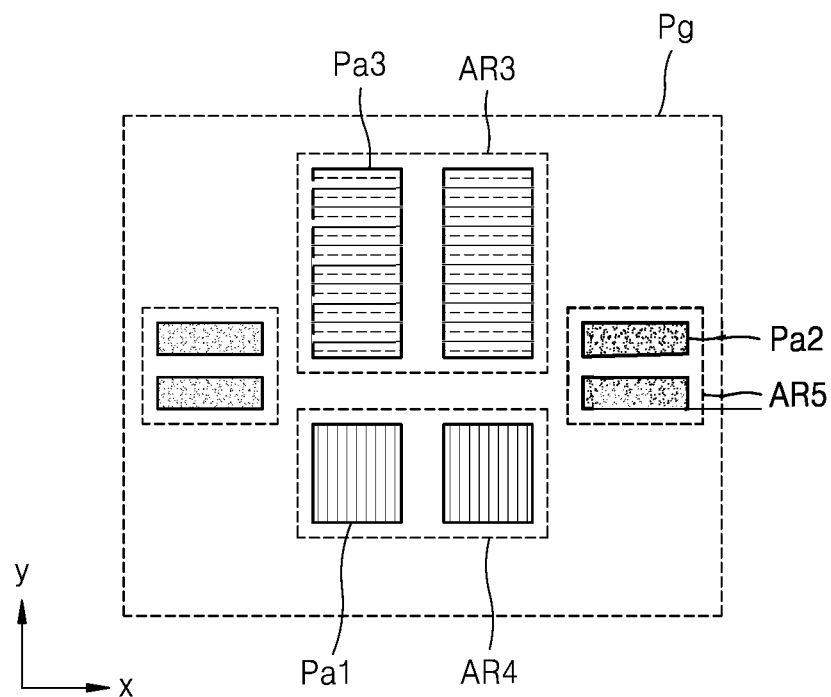
FIG. 20 is a schematic plan view of an arrangement of auxiliary sub-pixels arranged in a second display area according to another embodiment.

FIG. 20 is a schematic plan view of an arrangement of auxiliary sub-pixels Pa1, Pa2, Pa3 arranged in a second display area according to another embodiment.

Referring to FIG. 20, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide a red light, green light, and blue light, respectively. In this case, the first auxiliary sub-pixel Pa1, the second auxiliary sub-pixel Pa2, and the third auxiliary sub-pixel Pa3 may each have a rectangular shape and may be arranged in a pantile shape. In this case, the first auxiliary sub-pixel Pa1 to the third auxiliary sub-pixel Pa3 may be arranged similarly as illustrated in FIG. 17.

In this case, first auxiliary sub-pixels Pa1 adjacent to each other may share at least one of first auxiliary intermediate layers arranged in the entirety of a fourth area AR4, and second auxiliary sub-pixels Pa2 adjacent to each other may share at least one of second auxiliary intermediate layers arranged in the entirety of a fifth area AR5. In addition, third auxiliary sub-pixels Pa3 adjacent to each other may share at least one of third auxiliary intermediate layers arranged in the entirety of a third area AR3.

Thus, in the display device, the transmittance of the second display area may be improved.

Figure 21:
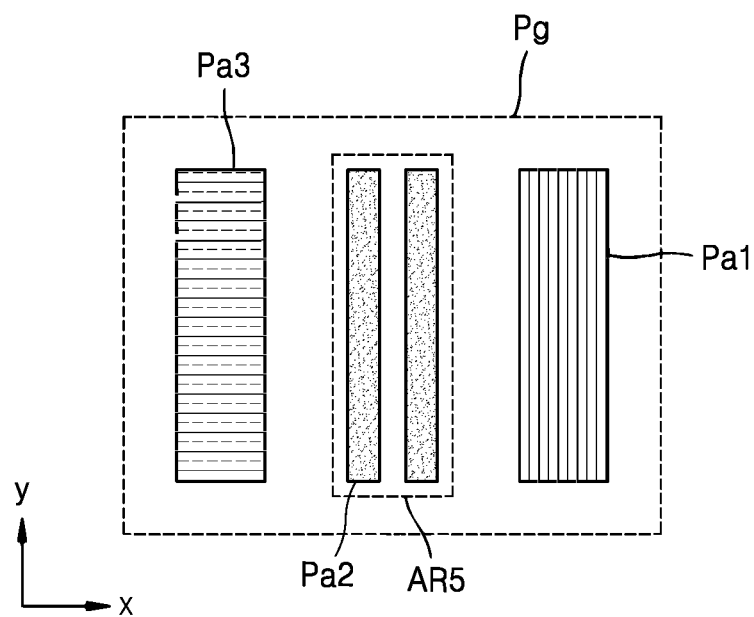
FIG. 21 is a schematic plan view of an arrangement of auxiliary sub-pixels arranged in a second display area according to another embodiment.

FIG. 21 is a schematic plan view of an arrangement of auxiliary sub-pixels Pa1, Pa2, Pa3 arranged in a second display area according to another embodiment.

Referring to FIG. 21, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. In this case, the first auxiliary sub-pixel Pa1, the second auxiliary sub-pixel Pa2, and the third auxiliary sub-pixel Pa3 may be arranged in a stripe structure.

That is, the first auxiliary sub-pixel Pa1, the second auxiliary sub-pixel Pa2, and the third auxiliary sub-pixel Pa3 may be arranged side by side in the x direction. The first auxiliary sub-pixel Pa1, the second auxiliary sub-pixel Pa2, and the third auxiliary sub-pixel Pa3 may be provided to be long in the y direction. In other words, each of the first auxiliary sub-pixel Pa1, the second auxiliary sub-pixel Pa2, and the third auxiliary sub-pixel Pa3 may have a short side and a long side where the long side extends in a second direction (e.g., a y direction) and the short side extends in a first direction (e.g., an x direction) crossing the second direction.

Alternatively, unlike in FIG. 21, the first auxiliary sub-pixel Pa1, the second auxiliary sub-pixel Pa2, and the third auxiliary sub-pixel Pa3 may be arranged side by side in the y direction. The first auxiliary sub-pixel Pa1, the second auxiliary sub-pixel Pa2, and the third auxiliary sub-pixel Pa3 may be provided to be long in the x direction. In other words, each of the first auxiliary sub-pixel Pa1, the second auxiliary sub-pixel Pa2, and the third auxiliary sub-pixel Pa3 may have a short side and a long side where the short side extends in a first direction (e.g., an x direction) and the long side extends in a second direction (e.g., a y direction) crossing the first direction.

In this case, a plurality of second auxiliary sub-pixels Pa2 may be provided between the first auxiliary sub-pixel Pa1 and the third auxiliary sub-pixel Pa3. In this case, the plurality of second auxiliary sub-pixels Pa2 may share at least one of second auxiliary intermediate layers arranged in a fifth area AR5 (e.g., fifth area AR5 in an alternate embodiment to the embodiment of FIG. 21). That is, the plurality of second auxiliary sub-pixels Pa2 may share a second auxiliary emission layer arranged in the fifth region AR5.

Thus, in the display device, a transmission portion as wide as possible may be secured.

Figure 22:
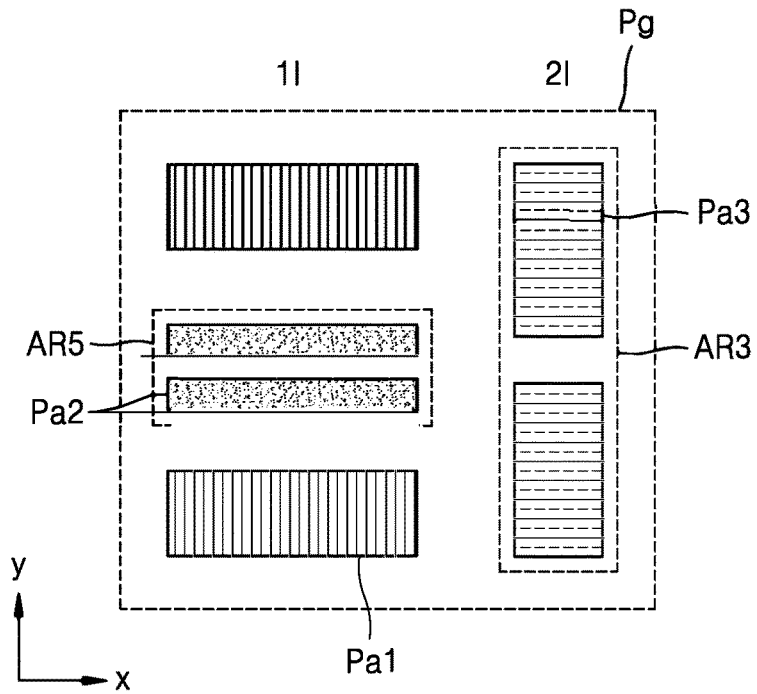
FIG. 22 is a schematic plan view of an arrangement of auxiliary sub-pixels arranged in a second display area according to another embodiment.

FIG. 22 is a schematic plan view of an arrangement of auxiliary sub-pixels Pa1, Pa2, Pa3 arranged in a second display area according to another embodiment.

Referring to FIG. 22, the second display area, which corresponds to the second display area DA2 in FIG. 5, may include an auxiliary light-emitting area Pg and a transmission portion TA. The auxiliary light-emitting area Pg and the transmission portion TA may be similar to those shown in FIG. 5.

A plurality of auxiliary sub-pixels Pa1, Pa2, and Pa3 may be arranged in the auxiliary light-emitting area Pg. The plurality of auxiliary sub-pixels Pa1, Pa2, and Pa3 may include a first auxiliary sub-pixel Pa1, a second auxiliary sub-pixel Pa2, and a third auxiliary sub-pixel Pa3. In this case, the auxiliary sub-pixels Pa1, Pa2, and Pa3 arranged in the second display area DA2 may be arranged in a stripe structure. The first auxiliary sub-pixel Pa1, the second auxiliary sub-pixel Pa2, and the third auxiliary sub-pixel Pa3 may implement or provide different colors. For example, the first auxiliary sub-pixel Pa1, the second auxiliary sub-pixel Pa2, and the third auxiliary sub-pixel Pa3 may implement red, green, and blue, respectively. In other words, the first auxiliary sub-pixel Pa1, the second auxiliary sub-pixel Pa2, and the third auxiliary sub-pixel Pa3 may provide red light, green light, and blue light, respectively.

The first auxiliary sub-pixel Pa1 and the second auxiliary sub-pixel Pa2 may be arranged in a first column 1I, and the third auxiliary sub-pixel Pa3 may be arranged in an adjacent second column 2I. One third auxiliary sub-pixel Pa3 may be provided to correspond to one first auxiliary sub-pixel Pa1 and one second auxiliary sub-pixel Pa2, and the size of the third auxiliary sub-pixel Pa3 may be greater than the sizes of the first auxiliary sub-pixel Pa1 and the second auxiliary sub-pixel Pa2. That is, the first auxiliary sub-pixel Pa1 and the second auxiliary sub-pixel Pa2 may be arranged to be long in the x direction, and the third auxiliary sub-pixel Pa3 may be arranged to be long in the y direction. Accordingly, the length of the third auxiliary sub-pixel Pa3 in the y direction may be equal to or greater than the sum of the length of the first auxiliary sub-pixel Pa1 in the y direction and the length of the second auxiliary sub-pixel Pa2 in the y direction. Such a pixel arrangement structure is called an S-stripe structure.

The first auxiliary sub-pixel Pa1, the second auxiliary sub-pixel Pa2, and the third auxiliary sub-pixel Pa3 may form one auxiliary light-emitting area Pg. In FIG. 5, one auxiliary light-emitting area Pg includes eight auxiliary sub-pixels Pa1, Pa2, and Pa3. However, the number and arrangement of auxiliary sub-pixels Pa1, Pa2, and Pa3 included in one auxiliary light-emitting area Pg may be variously modified in a suitable manner.

In this case, second auxiliary sub-pixels Pa2 adjacent to each other may be arranged between first auxiliary sub-pixels Pa1 spaced apart from each other. In this case, the second auxiliary sub-pixels Pa2 adjacent to each other may share at least one of second auxiliary intermediate layers arranged in a fifth area AR5.

In addition, the third auxiliary sub-pixels Pa3 adjacent to each other may share at least one of third auxiliary intermediate layers arranged in a third area AR3.

Thus, in the display device, the size of an auxiliary light-emitting area Pg may be reduced, and thus, the transmittance of the second display area may be improved.

Figure 23:
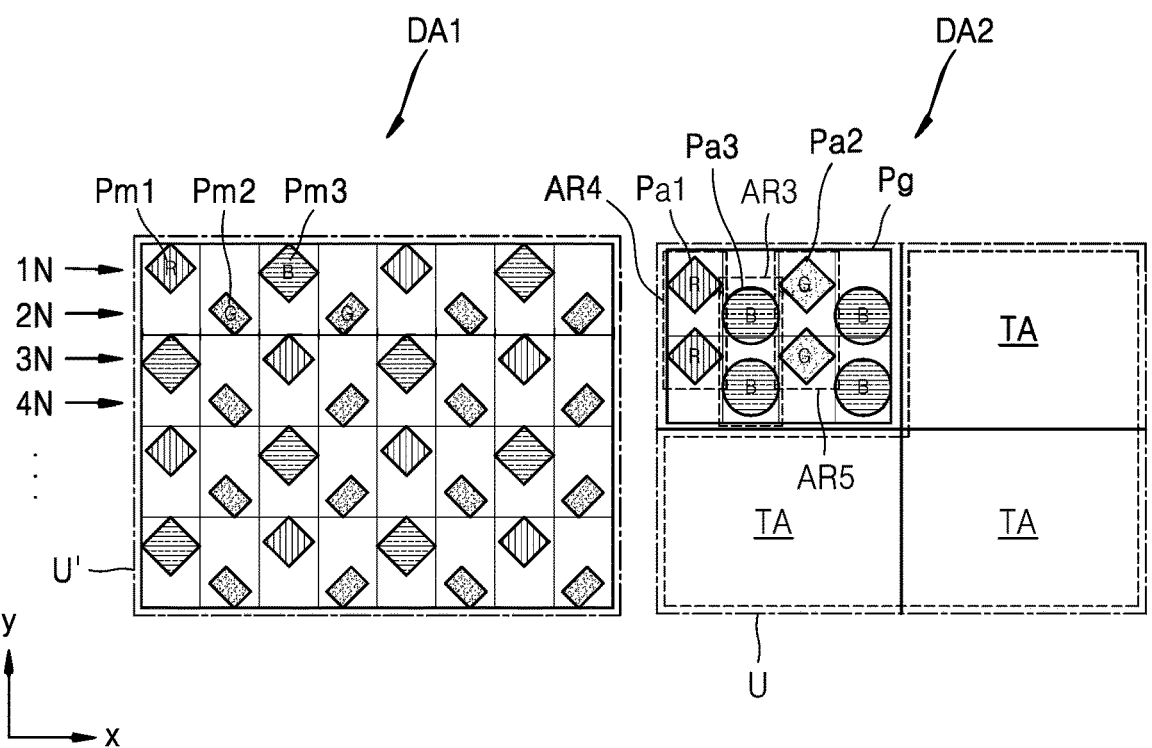
FIG. 23 is a schematic plan view of an arrangement of sub-pixels arranged in a first display area and a second display area according to another embodiment.

FIG. 23 is a schematic plan view of an arrangement of sub-pixels Pm1, Pm2 and Pm3 and Pa1, Pa2 and Pa3 arranged in a first display area DA1 and a second display area DA2 according to another embodiment.

Referring to FIG. 23, main sub-pixels Pm1, Pm2, and Pm3 arranged in a first display area DA1 and auxiliary sub-pixels Pa1, Pa2, and Pa3 arranged in a second display area DA2 may have different pixel arrangement structures.

In the present embodiment, a first main sub-pixel Pm1 and a first auxiliary sub-pixel Pa1 may implement red, a second main sub-pixel Pm2 and a second auxiliary sub-pixel Pa2 may implement green, and a third main sub-pixel Pm3 and a third auxiliary sub-pixel Pa3 may implement blue. In other words, a first main sub-pixel Pm1 and a first auxiliary sub-pixel Pa1 may provide a red light, a second main sub-pixel Pm2 and a second auxiliary sub-pixel Pa2 may provide a green light, and a third main sub-pixel Pm3 and a third auxiliary sub-pixel Pa3 may provide a blue light.

In the present embodiment, third main sub-pixels Pm3, which implement blue (or provide blue light) in the first display area DA1, are arranged in odd rows (e.g., a first row 1N). However, third auxiliary sub-pixels Pa3, which implement blue in the second display area DA2, are arranged in even rows (e.g., a second row 2N). This arrangement is called an RGBG matrix structure (e.g., an RGBG Pentile® matrix structure).

Second main sub-pixels Pm2, which implement green (or provide green light) in the first display area DA1, are arranged in even rows such as the second row 2N. However, second auxiliary sub-pixels Pa2, which implement green in the second display area DA2, are arranged in odd rows such as the first row 1N. This arrangement is called an RBGB matrix structure (e.g., an RBGB Pentile® matrix structure). That is, the position of a blue sub-pixel and the position of a green sub-pixel are reversed in the first display area DA1 and the second display area DA2. In this case, first auxiliary sub-pixels Pa1 adjacent to each other may share a first auxiliary emission layer in a fourth region AR4, and second auxiliary sub-pixels Pa2 adjacent to each other may share a second auxiliary emission layer in a fifth area AR5. Third auxiliary sub-pixels Pa3 adjacent to each other may share a third auxiliary emission layer in a third area AR3.

In this case, because the interval between auxiliary sub-pixels, which emit light of the same color and are adjacent to each other, may be reduced, the area of an auxiliary light-emitting area Pg may be reduced and the area of a transmission portion TA may be increased.

Accordingly, the transmittance of the display device may be improved, thereby preventing or substantially preventing a malfunction of a component arranged in the second display area DA2.

Figure 24:
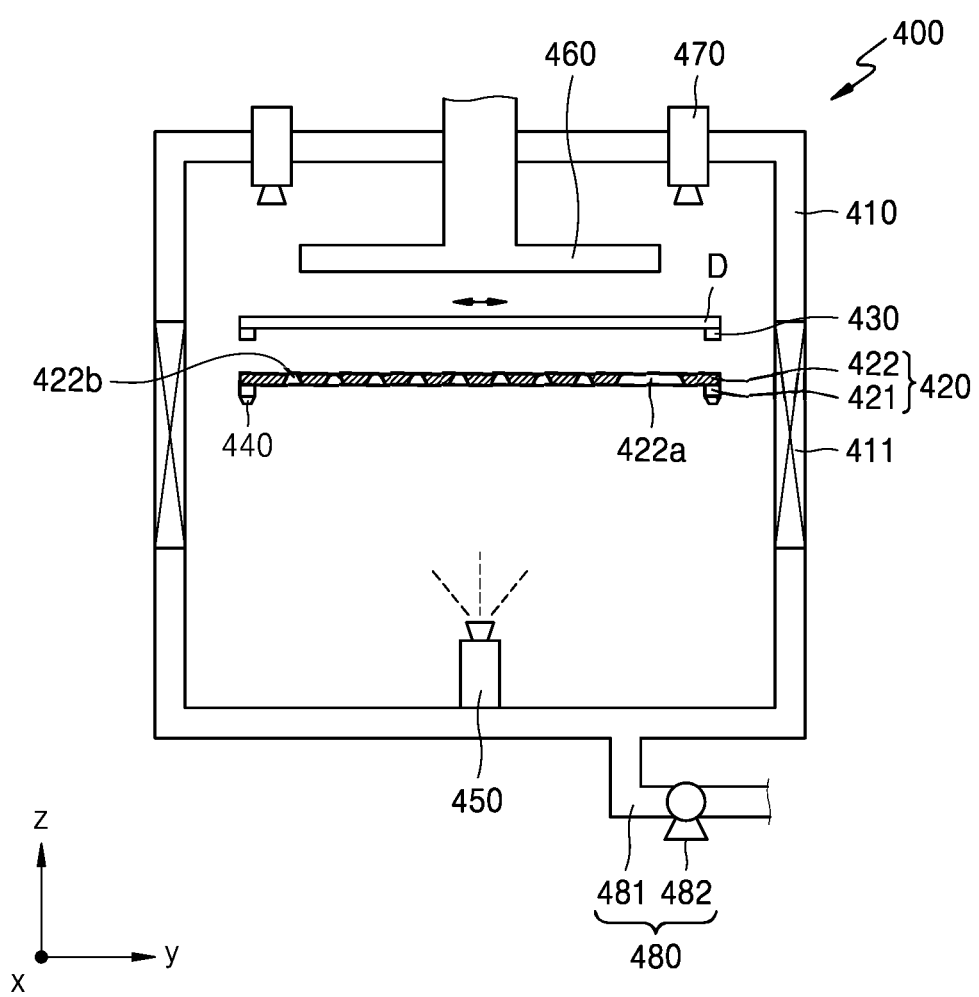
FIG. 24 is a cross-sectional view of an apparatus for manufacturing a display device, according to an embodiment.
Figure 25:
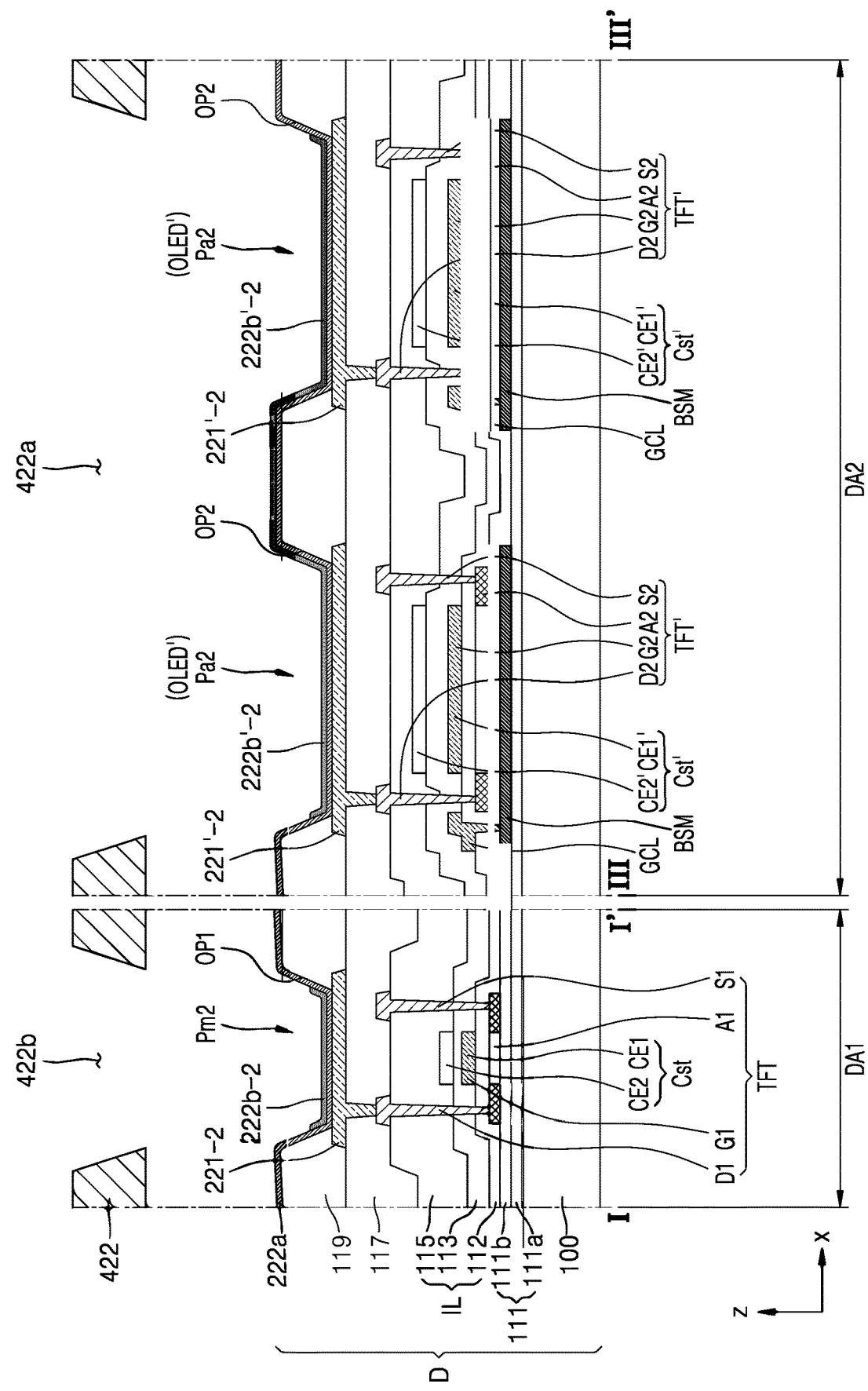
FIG. 25 is a cross-sectional view illustrating a method of manufacturing a second main emission layer and a second auxiliary emission layer of a display device through the apparatus illustrated in FIG. 24.

FIG. 24 is a cross-sectional view of an apparatus 400 for manufacturing a display device, according to an embodiment. FIG. 25 is a cross-sectional view illustrating a method of manufacturing a second main emission layer and a second auxiliary emission layer of a display device through the apparatus 400 illustrated in FIG. 24.

Referring to FIGS. 24 and 25, the display device may be manufactured by the apparatus 400 for manufacturing the display device.

The apparatus 400 may include a chamber 410, a mask assembly 420, a first support 430, a second support 440, a deposition source 450, a magnetic force generator 460, a vision unit 470, and a pressure adjuster 480.

The chamber 410 may have a space formed therein, and a portion thereof may be formed to have an opening. A gate valve 411 may be arranged in the opening of the chamber 410 to be opened or closed.

The mask assembly 420 may be arranged within the chamber 410. The mask assembly 420 may include a mask frame 421 and a mask sheet 422. The mask frame 421 may be formed by connecting a plurality of frames to each other, and may include an opening therein. In this case, the mask frame 421 may include one opening or a plurality of openings separated from or spaced apart from each other. In this case, the mask frame 421 may have a lattice shape (e.g., a window frame).

The mask sheet 422 may extend on the mask frame 421 and be fixed to the mask frame 421. The mask sheet 422 may have an opening through which a deposition material passes.

One mask sheet 422 or a plurality of mask sheets 422 may be included. When one mask sheet 422 is included, the mask sheet 422 may be arranged on the mask frame 421 and may shield the opening of the mask frame 421. According to another embodiment, when a plurality of mask sheets 422 are included, the plurality of mask sheets 422 may be arranged on the mask frame 421 to be adjacent to each other along one side of the mask frame 421, and may shield the opening of the mask frame 421. For convenience of description, a case where a plurality of mask sheets 422 are included will now be described in more detail.

The mask sheet 422 may include a first body unit including first openings 422a and a second body unit including second openings 422b. The first openings 422a and the second openings 422b may have different shapes and/or sizes from each other. For example, the size of a planar shape of each first opening 422a may be different from that of a planar shape of each second opening 422b. For example, the size of a planar shape of each first opening 422a may be greater than that of a planar shape of each second opening 422b as shown in FIG. 24. The size of a planar shape of an opening may be the size of a planar shape of an opening on one surface of the mask sheet 422 that faces the deposition source 450.

The mask assembly 420 may further include a support frame arranged on the mask frame 421. The support frame may be arranged in the opening of the mask frame 421, and may shield a gap between mask sheets 422 or may be arranged in a direction perpendicular to a lengthwise direction of the mask sheet 422.

A substrate 100 may be seated on the first support 430. In this case, the first support 430 may adjust a location of the substrate 100. For example, the first support 430 may include a UVW stage.

The mask assembly 420 may be seated on the second support 440. In this case, the second support 440 may adjust a location of the mask assembly 420, similar to the first support 430.

At least one of the first support 430 or the second support 440 may ascend or descend within the chamber 410. In this case, at least one of the first support 430 or the second support 440 may adjust a gap between a display substrate D and the mask frame 421.

The deposition material may be accommodated in the deposition source 450 and then vaporized or sublimed and provided to the chamber 410. The deposition source 450 may include a heater therein, and melt or sublime the deposition material by heating the deposition material within the deposition source 450 according to an operation of the heater. In this case, the deposition source 450 may be arranged at the center or corner of the chamber 410. Hereinafter, for convenience of description, a case in which the deposition source 450 is arranged at the center of the chamber 410 will be described in more detail below.

The magnetic force generator 460 may be arranged within the chamber 410 and may make the substrate 100 and the mask assembly 420 closely contact each other. In this case, the magnetic force generator 460 may include, for example, an electromagnet or permanent magnet that generates a magnetic force.

The vision unit 470 may be arranged within the chamber 410 and may photograph respective locations of the mask assembly 420 and the substrate 100. The vision unit 470 may photograph an alignment mark and the like of at least one of the mask assembly 420 or the substrate 100.

The pressure adjuster 480 may be connected to the chamber 410 and may adjust an internal pressure of the chamber 410. The pressure adjuster 480 may include a connection pipe 481 connected to the chamber 410, and a pump 482 provided on the connection pipe 481.

In an operation of the apparatus 400, when the pressure adjuster 480 maintains the internal pressure of the chamber 410 to be equal to, substantially equal to, or similar to an atmospheric pressure, the gate valve 411 may be opened, and the display substrate D and the mask assembly 420 may be inserted into the chamber 410. In this case, at least one of the display substrate D or the mask assembly 420 may be moved by a robot arm arranged outside the chamber 410 or a shuttle or the like inserted into or withdrawn from the chamber 410. In this case, as shown in FIG. 25, the display substrate D may include the substrate 100, layers arranged below a pixel-defining layer 119, the pixel-defining layer 119, and a pixel electrode.

After the mask frame 421 and the display substrate D are arranged on the second support 440 and the first support 430, respectively, the locations of the mask frame 421 and the display substrate D may be sensed by the vision unit 470 and may be arranged. Thereafter, the display substrate D and the mask frame 421 are brought close to each other, and then are made closely contact each other by the magnetic force generator 460.

When the deposition source 450 emits the deposition material, the deposition material may be deposited on the display substrate D via the first openings 422a and the second openings 422b of the mask sheet 422 and may form a pattern. In this case, the deposition material may be deposited on the display substrate D and may form at least one layer from among intermediate layers.

In this case, the deposition material that has passed through the first openings 422a and the second openings 422b of the mask sheet 422 may be deposited on a first display area DA1 and a second display area DA2 of the display substrate D, and thus at least one of intermediate layers may be formed on the first display area DA1 and the second display area DA2. Hereinafter, for convenience of description, a case in which a second main emission layer 222b-2 of a second main sub-pixel Pm2 and a second auxiliary emission layer 222b'-2 of a second auxiliary sub-pixel Pa2 are formed through the apparatus 400 will be described in more detail below.

Specifically, the deposition material passing through the first openings 422a may be deposited on second auxiliary pixel electrodes 221'-2 adjacent to each other. In this case, the deposition material may be deposited also on the pixel-defining layer 119 arranged between the second auxiliary pixel electrodes 221'-2 adjacent to each other, thereby forming one second auxiliary emission layer 222b'-2 that is integrally formed on the second auxiliary pixel electrodes 221'-2 adjacent to each other.

The second main emission layer 222b-2 may be formed on the second main pixel electrode 221-2 while the above-described operation is in progress. In this case, the second main emission layer 222b-2 and the second auxiliary emission layer 222b'-2 may be separated from each other.

When the above-described process is completed, the display substrate D may be carried out of the chamber 410 or may be moved to another place of the chamber 410 such that another layer may be formed on the display substrate D.

In addition to the above process, a first main emission layer and a first auxiliary emission layer may be concurrently (e.g., simultaneously) formed, and a third main emission layer and a third auxiliary emission layer may be concurrently (e.g., simultaneously) formed. Thereafter, a second functional layer, an opposite electrode, and the like may be concurrently (e.g., simultaneously) formed.

In this case, the manufacturing method as described above is only one embodiment, and in the case of forming a main emission layer and an auxiliary emission layer, deposition materials that implement or provide the same color may be deposited in various suitable orders.

Thus, the apparatus 400 may form an intermediate layer having an accurate pattern on the first and second display areas DA1 and DA2. The apparatus 400 may also form an intermediate layer having almost the same pattern as a designed pattern on the first or second display area DA1 and DA2.

As described above, the present embodiments may provide a display device capable of securing a transmission area as large as possible as a plurality of auxiliary sub-pixels emitting light of the same color from among auxiliary sub-pixels in the second display area may share some layers (e.g., intermediate layers).

The present embodiments may provide a display device that reduces noise during operation of an optical element or the like arranged in the second display area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising:
   a substrate;
   a first display area in which a plurality of main sub-pixels are on the substrate; and
   a second display area in which a basic unit is arranged, the basic unit comprising an auxiliary light-emitting area, in which a plurality of auxiliary sub-pixels are on the substrate, and a transmission portion,
   wherein each of the plurality of auxiliary sub-pixels comprises a pixel electrode on the substrate, an intermediate layer on the pixel electrode, and an opposite electrode on the intermediate layer, and
   wherein the intermediate layers of auxiliary sub-pixels for emitting light of a same color from among the plurality of auxiliary sub-pixels are connected to each other and disconnected from the intermediate layers of auxiliary sub-pixels for emitting light of a different color from among the plurality of auxiliary sub-pixels; and
   wherein the auxiliary light-emitting area and the transmission portion of the second display area overlap a component, the component comprising a sensor, and the plurality of main sub-pixels in the first display area does not overlap the component.

2. The display device of claim 1, wherein the plurality of auxiliary sub-pixels are arranged in a stripe structure.

3. The display device of claim 1, wherein the plurality of auxiliary sub-pixels are arranged in an RGBG Pentile matrix structure.

4. The display device of claim 1, further comprising an inorganic insulating layer on the substrate,
   wherein the inorganic insulating layer includes an opening corresponding to the transmission portion.

5. The display device of claim 1, wherein the opposite electrode is integrally provided in the plurality of main sub-pixels in the first display area and the plurality of auxiliary sub-pixels in the second display area and includes an opening corresponding to the transmission portion.

6. The display device of claim 1, wherein the plurality of auxiliary sub-pixels comprise:
   a first auxiliary sub-pixel to emit light of a first color; and
   a plurality of second auxiliary sub-pixels to emit light of a second color,
   wherein a distance between the first auxiliary sub-pixel and each of the second auxiliary sub-pixels is different from a distance between second auxiliary sub-pixels adjacent to each other from among the plurality of second auxiliary sub-pixels.

7. The display device of claim 1, wherein the intermediate layer comprises at least one of an organic functional layer or an emission layer.

8. The display device of claim 7, wherein the emission layers of the intermediate layers of the auxiliary sub-pixels to emit light of the same color from among the plurality of auxiliary sub-pixels are connected to each other.

9. The display device of claim 1, wherein the plurality of auxiliary sub-pixels comprise:
   a plurality of first auxiliary sub-pixels to emit light of a first color; and
   a plurality of second auxiliary sub-pixels to emit light of a second color,
   wherein at least two of the plurality of second auxiliary sub-pixels are between first auxiliary sub-pixels adjacent to each other from among the plurality of first auxiliary sub-pixels.

10. A display device comprising:
    a substrate on which a first display area, in which main sub-pixels are arranged, and a second display area, which comprises an auxiliary light-emitting area and a transmission portion, are arranged;
    a first auxiliary sub-pixel arranged in the auxiliary light-emitting area, the first auxiliary sub-pixel to emit light of a first color and comprising a first auxiliary pixel electrode and a first auxiliary intermediate layer;
    a plurality of second auxiliary sub-pixels spaced apart from each other in the auxiliary light-emitting area and to emit light of a second color, each of the second auxiliary sub-pixels comprising a second auxiliary pixel electrode and a second auxiliary intermediate layer; and
    an opposite electrode integrally arranged in the auxiliary light-emitting area,
    wherein at least two of the plurality of second auxiliary sub-pixels share a same emission layer of the second auxiliary intermediate layer; and
    wherein the auxiliary light-emitting area and the transmission portion of the second display area overlap a component, the component comprising a sensor, and the plurality of main sub-pixels in the first display area does not overlap the component.

11. The display device of claim 10, further comprising a functional layer between the second auxiliary pixel electrode and the opposite electrode,
    wherein the functional layer corresponds to the transmission portion.

12. The display device of claim 10, further comprising an inorganic insulating layer on the substrate,
    wherein the inorganic insulating layer includes an opening corresponding to the transmission portion.

13. The display device of claim 10, wherein the first display area and the second display area are sealed by an encapsulation substrate facing the substrate.

14. The display device of claim 10, further comprising a thin-film encapsulation layer comprising a first inorganic encapsulation layer, an organic encapsulation layer, and a second inorganic encapsulation layer sequentially arranged on the opposite electrode.

15. The display device of claim 10, wherein a length direction of the first auxiliary sub-pixel is different from a length direction of a second auxiliary sub-pixel of the plurality of second auxiliary sub-pixels.

16. The display device of claim 10, wherein a length direction of the first auxiliary sub-pixel is parallel to a length direction of a second auxiliary sub-pixel of the plurality of second auxiliary sub-pixels.

17. The display device of claim 10, wherein at least one of the first or second auxiliary sub-pixels are arranged in an RGBG Pentile matrix structure.

18. The display device of claim 10, further comprising a plurality of first auxiliary sub-pixels comprising the first auxiliary sub-pixel,
wherein the at least two of the plurality of second auxiliary sub-pixels are between first auxiliary sub-pixels adjacent to each other from among the plurality of first auxiliary sub-pixels.

19. The display device of claim 10, further comprising a plurality of first auxiliary sub-pixels comprising the first auxiliary sub-pixel, wherein at least two of the plurality of first auxiliary sub-pixels share the first auxiliary intermediate layer.

20. A display device comprising:
a substrate on which a first display area, in which main sub-pixels are arranged, and a second display area, which comprises an auxiliary light-emitting area and a transmission portion, are arranged; and
a plurality of auxiliary sub-pixels arranged in the auxiliary light-emitting area, each of the auxiliary sub-pixels comprising a pixel electrode and an intermediate layer,
wherein the plurality of auxiliary sub-pixels comprise at least two auxiliary pixels to emit light of a same color,
wherein the intermediate layers of at least two auxiliary sub-pixels for emitting light of the same color from among the plurality of auxiliary sub-pixels are connected to each other and disconnected from the intermediate layers of auxiliary sub-pixels for emitting light of a different color from among the plurality of auxiliary sub-pixels, and
wherein the auxiliary sub-pixels comprising the intermediate layers connected to each other emit at least one of blue light, green light, or red light; and
wherein the auxiliary light-emitting area and the transmission portion of the second display area overlap a component, the component comprising a sensor, and the plurality of main sub-pixels in the first display area does not overlap the component.

* * * * *